(12) United States Patent
Ye et al.

(10) Patent No.: US 11,908,892 B2
(45) Date of Patent: Feb. 20, 2024

(54) SEMICONDUCTOR DEVICE AND FORMATION METHOD

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Hung-Yu Ye, Taichung (TW); Yu-Shiang Huang, New Taipei (TW); Chien-Te Tu, Taipei (TW); Chee-Wee Liu, Taipei (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 293 days.

(21) Appl. No.: 17/372,108

(22) Filed: Jul. 9, 2021

(65) Prior Publication Data
US 2022/0310787 A1    Sep. 29, 2022

Related U.S. Application Data

(60) Provisional application No. 63/166,046, filed on Mar. 25, 2021.

(51) Int. Cl.
*H01L 29/06* (2006.01)
*H01L 21/8234* (2006.01)

(52) U.S. Cl.
CPC .. *H01L 29/0673* (2013.01); *H01L 21/823418* (2013.01); *H01L 21/823431* (2013.01)

(58) Field of Classification Search
CPC .......... H01L 29/0673; H01L 29/42392; H01L 21/823431; H01L 21/823418;
(Continued)

(56) References Cited

U.S. PATENT DOCUMENTS

| 10,535,737 B2 | 1/2020 | Lu |
| 2016/0276484 A1 | 9/2016 | Kim et al. |

(Continued)

FOREIGN PATENT DOCUMENTS

| TW | I565058 B | 1/2017 |
| TW | I669269 B | 8/2019 |

(Continued)

OTHER PUBLICATIONS

P. Weckx et al., "Novel forksheet device architecture as ultimate logic scaling device towards 2nm", 2019 IEEE International Electron Devices Meeting (IEDM), 2019, pp. 36.5.1-36.5.4.
(Continued)

*Primary Examiner* — Changhyun Yi
(74) *Attorney, Agent, or Firm* — Maschoff Brennan

(57) ABSTRACT

A device comprises source/drain regions over a substrate and spaced apart along a first direction, a first gate structure between the source/drain regions, and a first channel structure surrounded by the first gate structure. The first channel structure comprises alternately stacking first semiconductor layers and second semiconductor layers. When viewed in a cross section taken along a second direction perpendicular to the first direction, central axes of the second semiconductor layers are laterally offset from central axes of the first semiconductor layers.

20 Claims, 50 Drawing Sheets

(58) Field of Classification Search
CPC ............ H01L 27/088; H01L 29/78696; H01L 29/7853; H01L 29/66795; H01L 29/66439
See application file for complete search history.

(56) References Cited

U.S. PATENT DOCUMENTS

| | | | |
|---|---|---|---|
| 2018/0083007 A1* | 3/2018 | Lee ...................... | H01L 27/092 |
| 2019/0058052 A1 | 2/2019 | Frougier et al. | |
| 2019/0221483 A1* | 7/2019 | Mulfinger .............. | B82Y 10/00 |
| 2020/0091152 A1* | 3/2020 | Noh ...................... | H01L 27/092 |
| 2020/0357930 A1 | 11/2020 | Glass et al. | |
| 2021/0193654 A1* | 6/2021 | Park ...................... | H01L 29/785 |

FOREIGN PATENT DOCUMENTS

| | | |
|---|---|---|
| TW | 202107704 A | 2/2021 |
| WO | 2007/115954 A1 | 10/2007 |

OTHER PUBLICATIONS

S. Borel et al., "Isotropic etching of SiGe alloys with high selectivity to similar materials", Microelectronic Engineering 73-74, 2004, pp. 301-305.

N. Posseme et al., "Thin layer etching of silicon nitride: A comprehensive study of selective removal using NH3/NF3 remote plasma", Journal of Vacuum Science & Technology A, vol. 34, No. 6, 2016, pp. 061301-1~061301-10.

H. Nishino et al., "Damage-free selective etching of Si native oxides using NH3/NF3 and SF6/H2O down-flow etching", Journal of Applied Physics, vol. 74, No. 2, 1993, pp. 1345-1348.

* cited by examiner

2

NS
IB

3

NS
IB

2NS+1IB
3 → (W/ side IB) / (W/ middle IB) ← #2

$W_{NS}=W1$ nm; $H_{IB}=H1$ nm

| $t_{NS}$ \ $W_{IB}$ | A nm | B nm | C nm |
|---|---|---|---|
| A nm | 4.63/4.26 (+8.7%) | 4.25/3.89 (+9.2%) | 3.76/3.60 (+4.4%) |
| B nm | 4.73/4.36 (+8.5%) | 4.47/4.11 (+9.0%) | 4.02/3.88 (+3.6%) |
| C nm | 5.02/4.67 (+7.5%) | 4.81/4.51 (+6.6%) | 4.48/4.35 (+3.0%) |

Fig. 6A

| $W_{IB1}$  $W_{IB2}$ | \multicolumn{3}{c}{$W_{NS}$=W1 nm; $H_{IB}$=H1 nm; $t_{NS}$=A nm} | | |
|---|---|---|---|
| | A nm | B nm | C nm |
| A nm | 9.45 | 9.09 | 8.64 |
| B nm | -- | 8.83 | 8.44 |
| C nm | -- | -- | 7.96 |

Fig. 8B

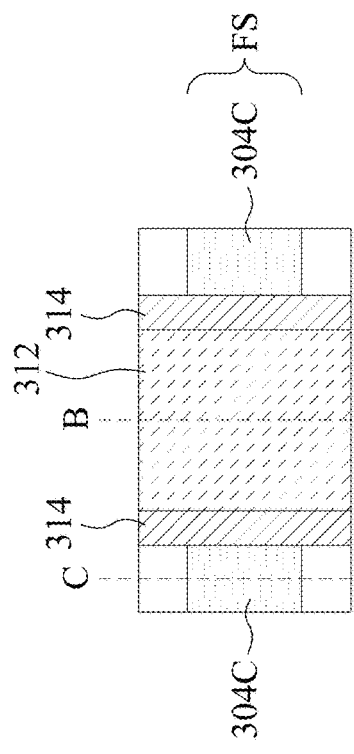
Fig. 12A
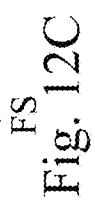
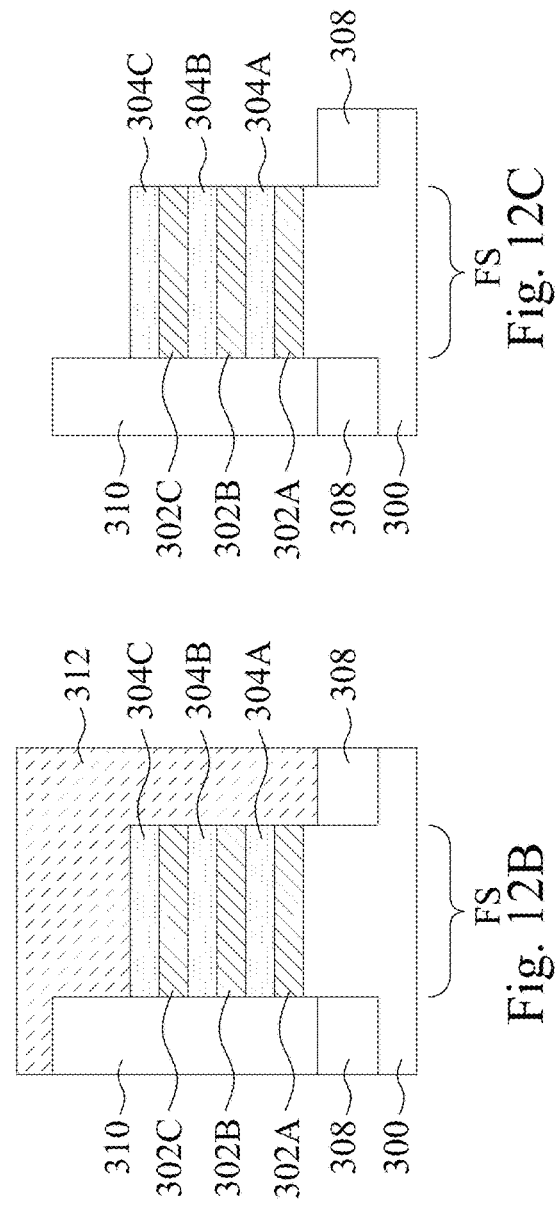
Fig. 12C
Fig. 12B

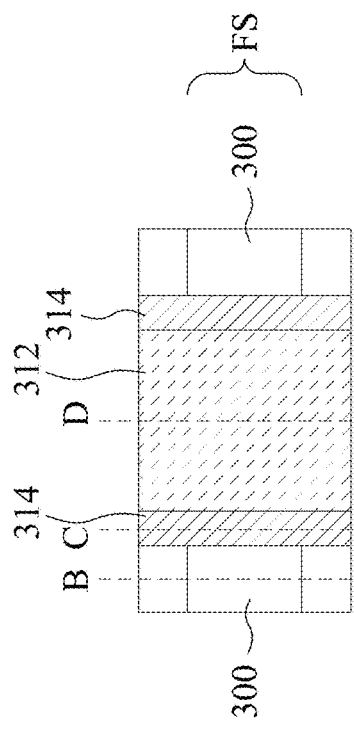
Fig. 13A
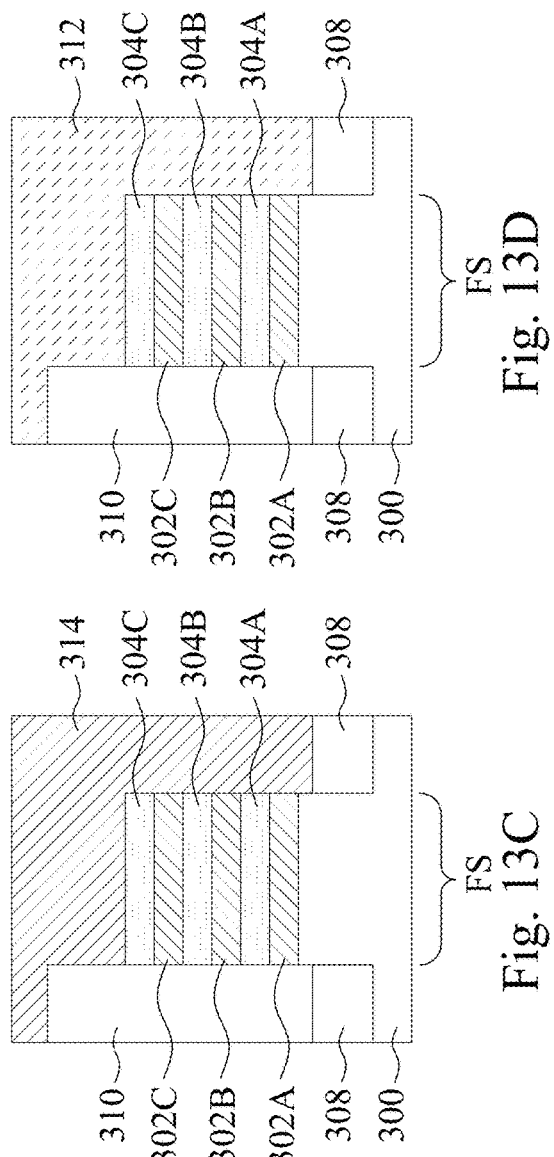
Fig. 13D
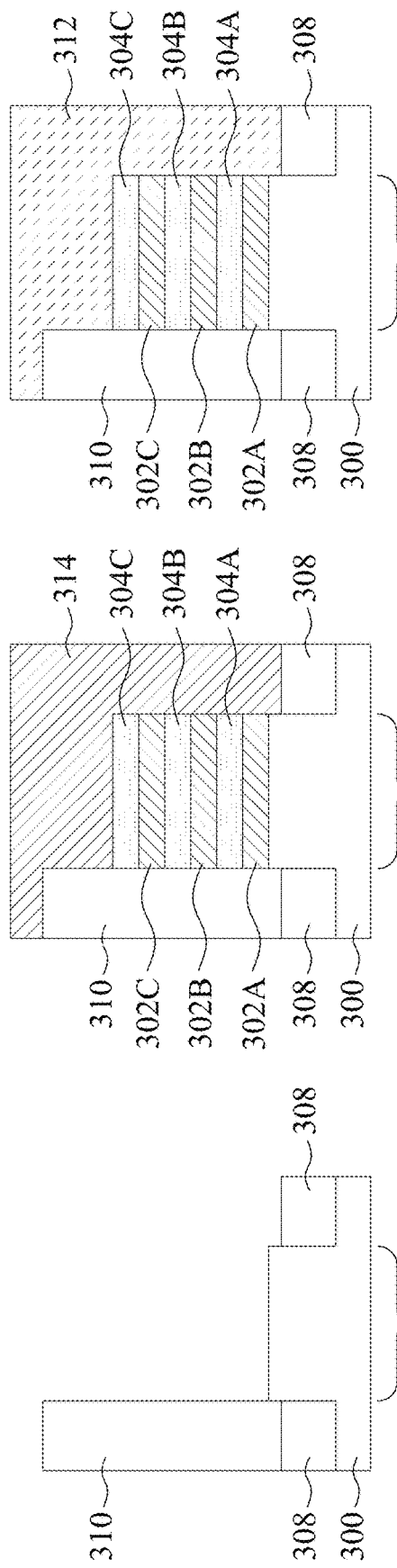
Fig. 13C
Fig. 13B

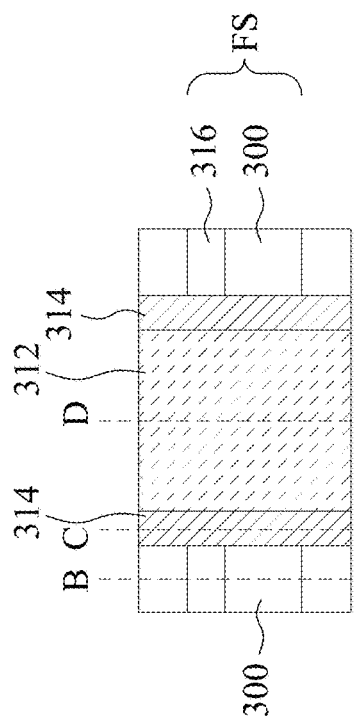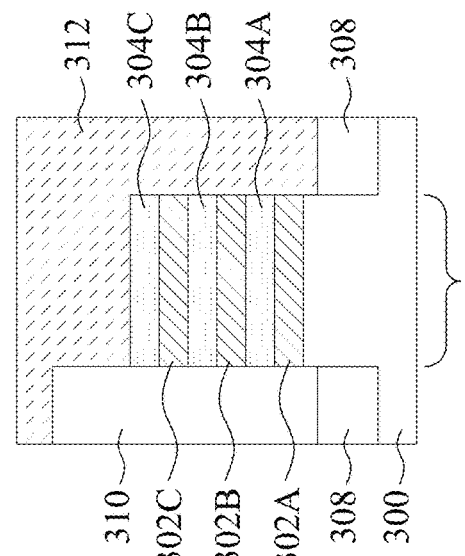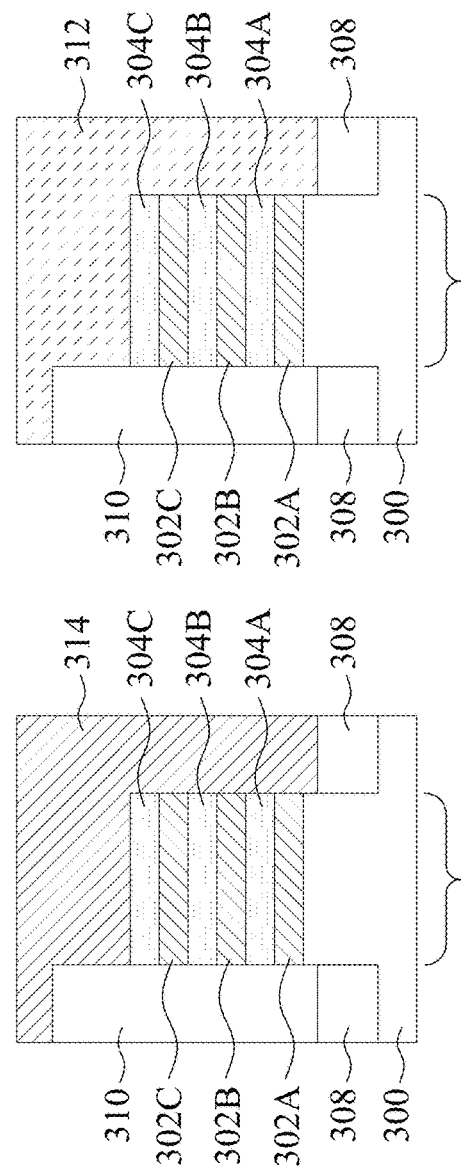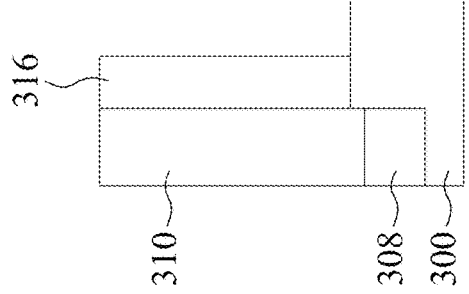
Fig. 14A
Fig. 14B
Fig. 14C
Fig. 14D

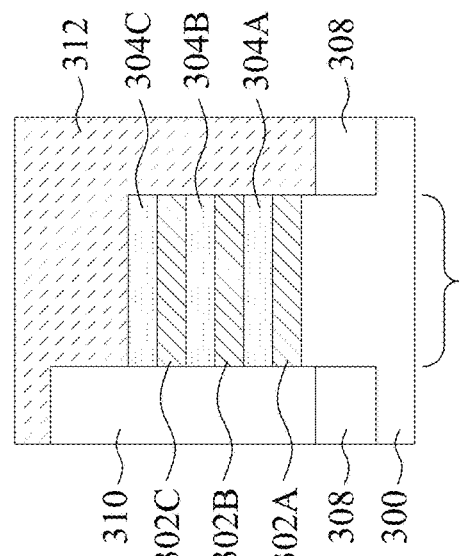
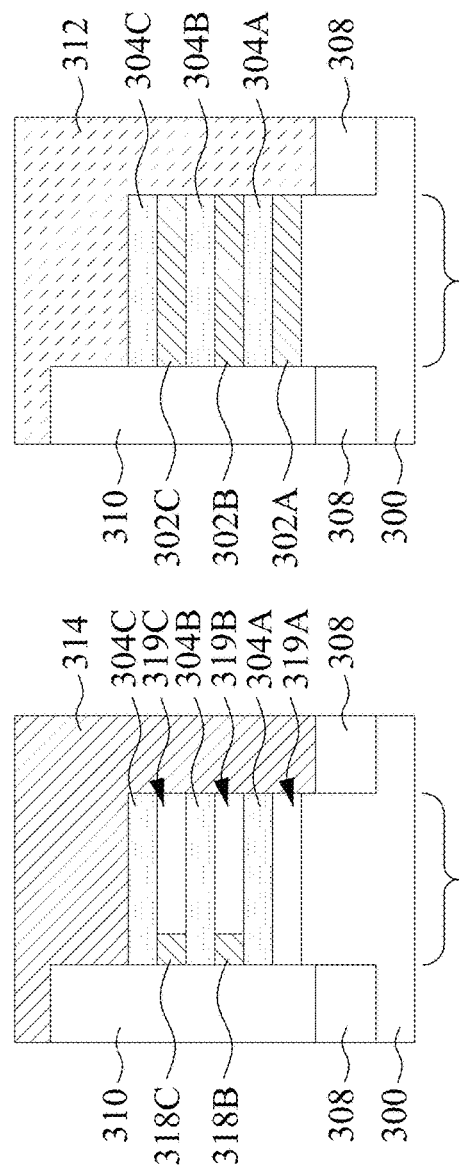
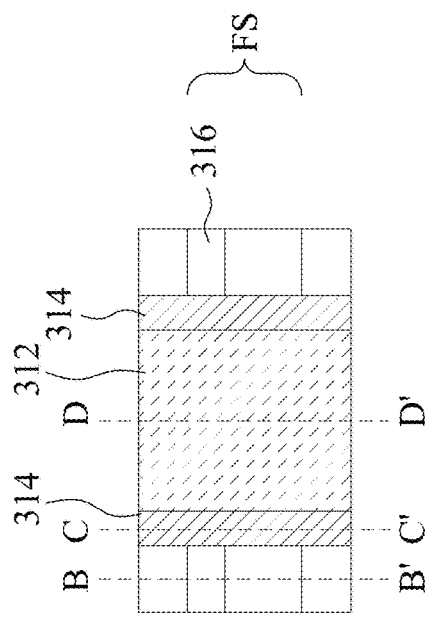
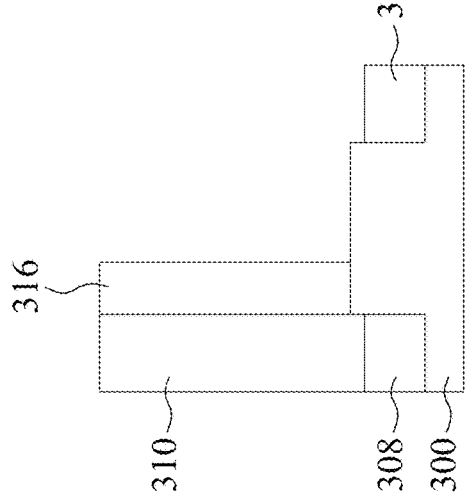

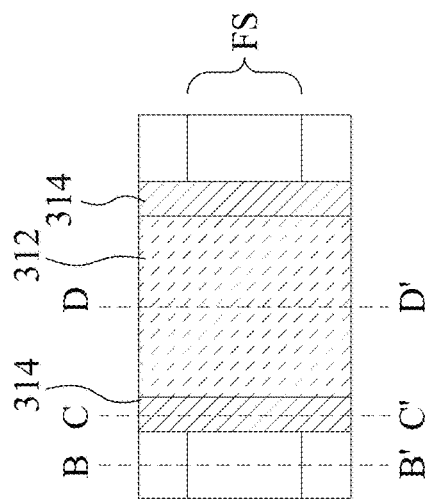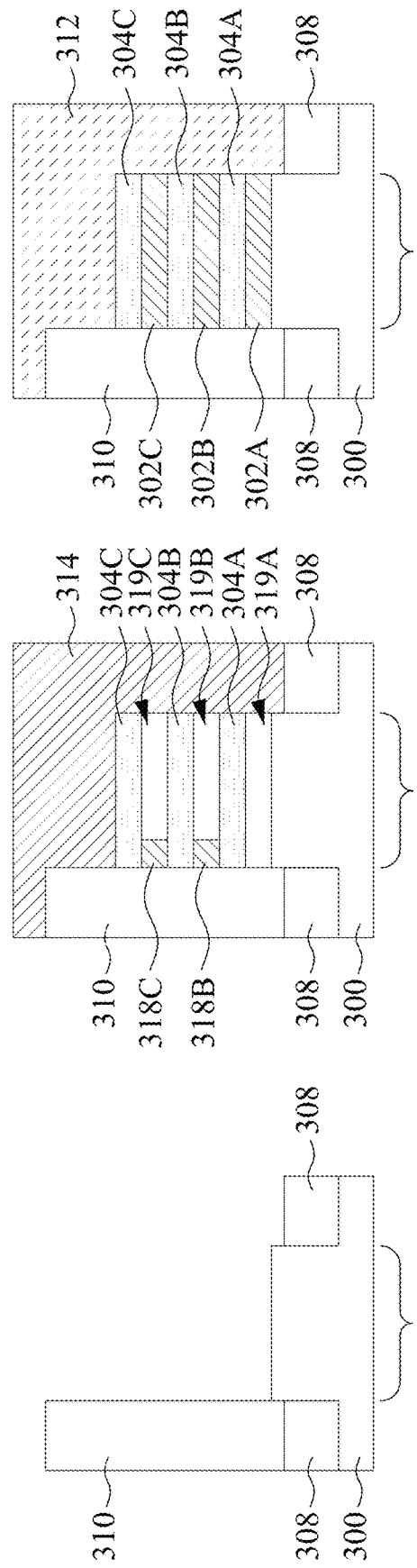

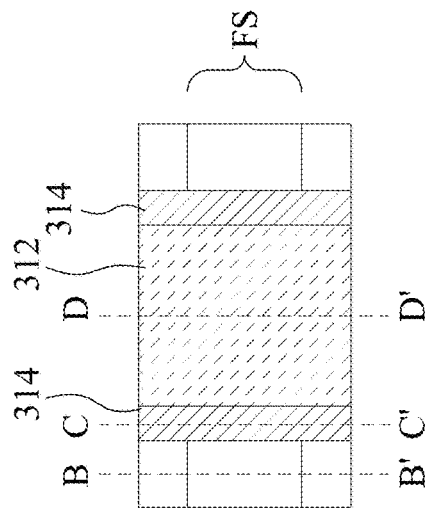
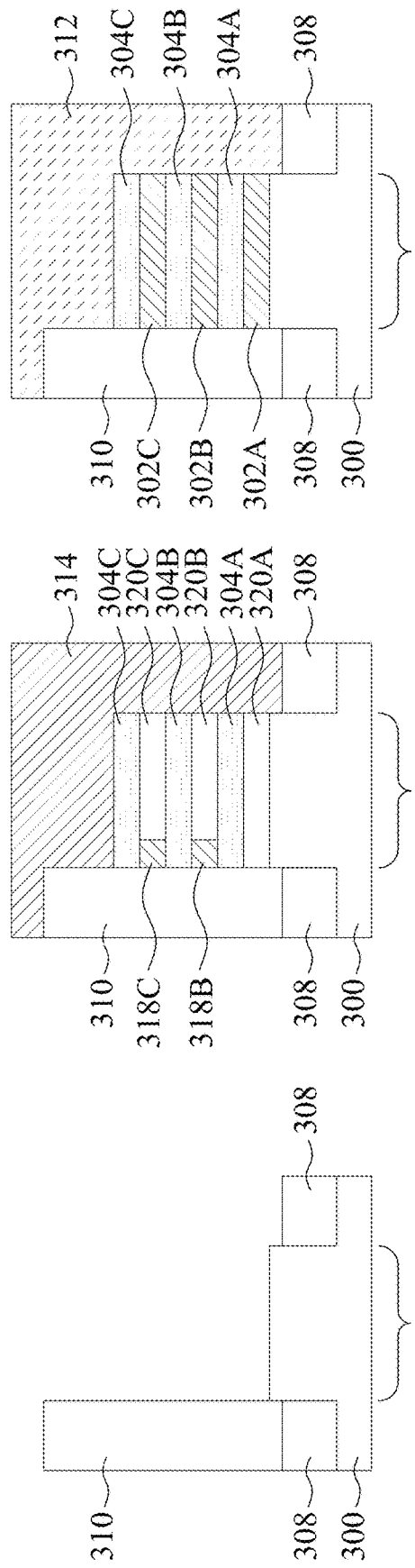

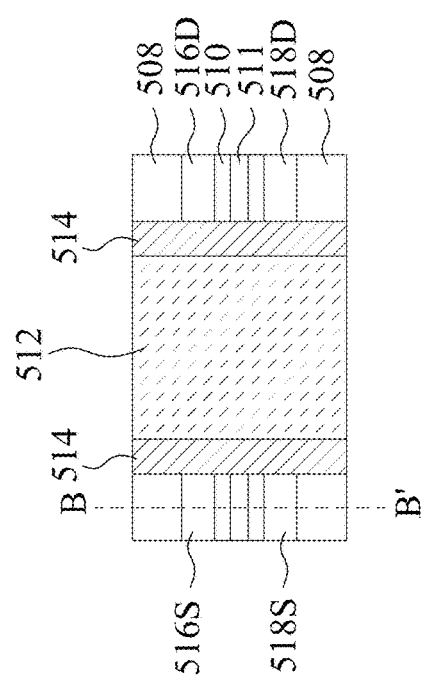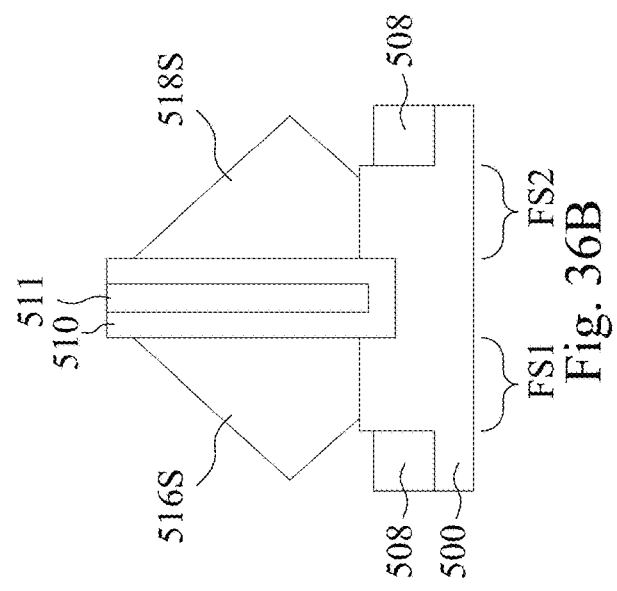

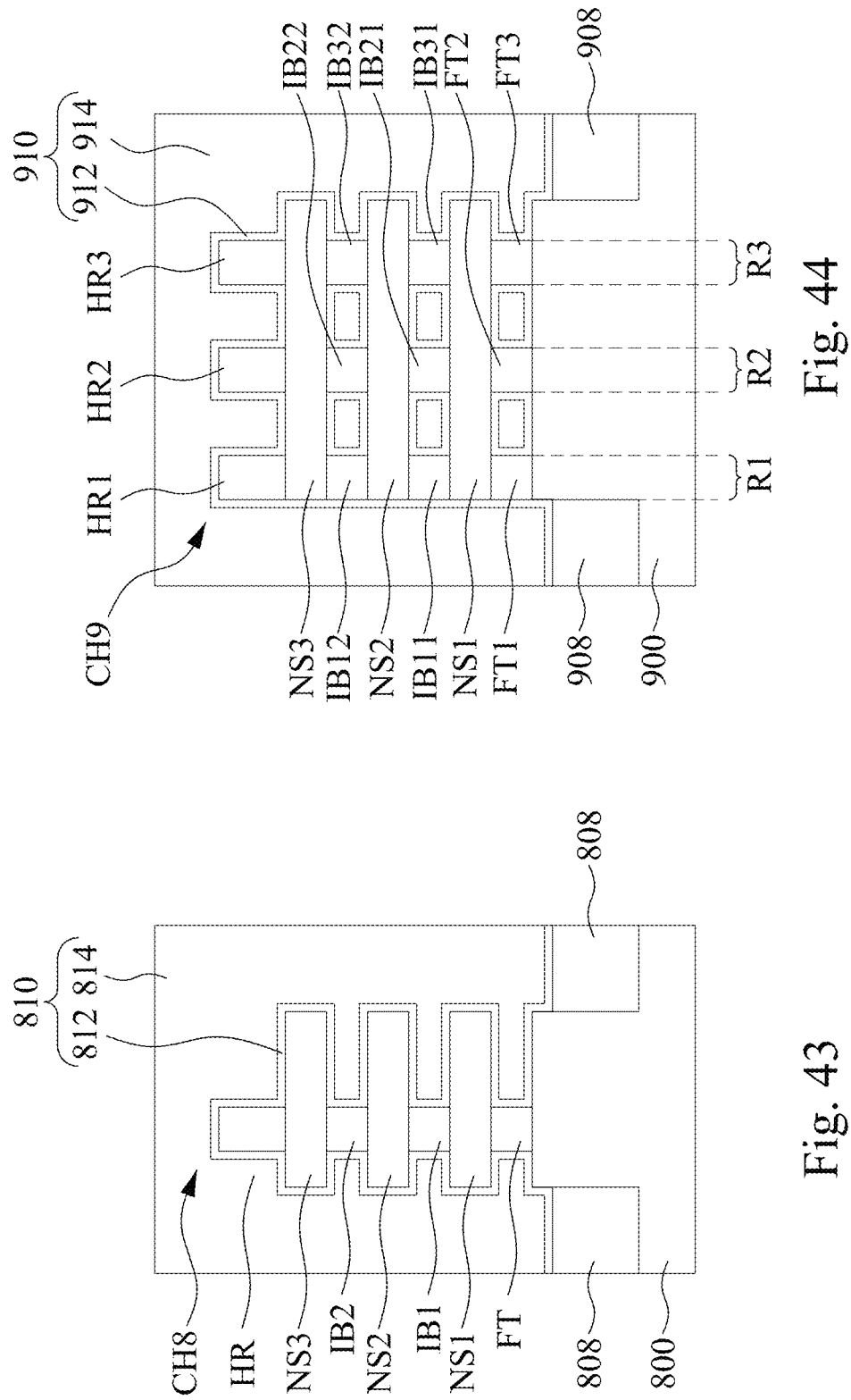

SEMICONDUCTOR DEVICE AND FORMATION METHOD

PRIORITY CLAIM AND CROSS-REFERENCE

This application claims the benefit of U.S. Provisional Application No. 63/166,046, filed on Mar. 25, 2021, which application is hereby incorporated herein by reference in its entirety.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6D are simulation results showing electron density improvement ratio between different nano-FETs according to some embodiments of the present disclosure.

FIG. 8B shows simulation results of electron density in nano-FETs having various interbridge channel width differences, in accordance with some embodiments of the present disclosure.

FIGS. 10A-22B are top views and cross-sectional views of intermediate stages in the manufacturing of a nano-FET, in accordance with some embodiments of the present disclosure.

FIGS. 32A-40B are top views and cross-sectional views of intermediate stages in the manufacturing of nano-FETs, in accordance with some embodiments of the present disclosure.

FIG. 43 is a cross-sectional view of a nano-FET in accordance with some embodiments of the present disclosure.

FIG. 44 is a cross-sectional view of a nano-FET in accordance with some embodiments of the present disclosure.

DETAILED DESCRIPTION

Figure 1:
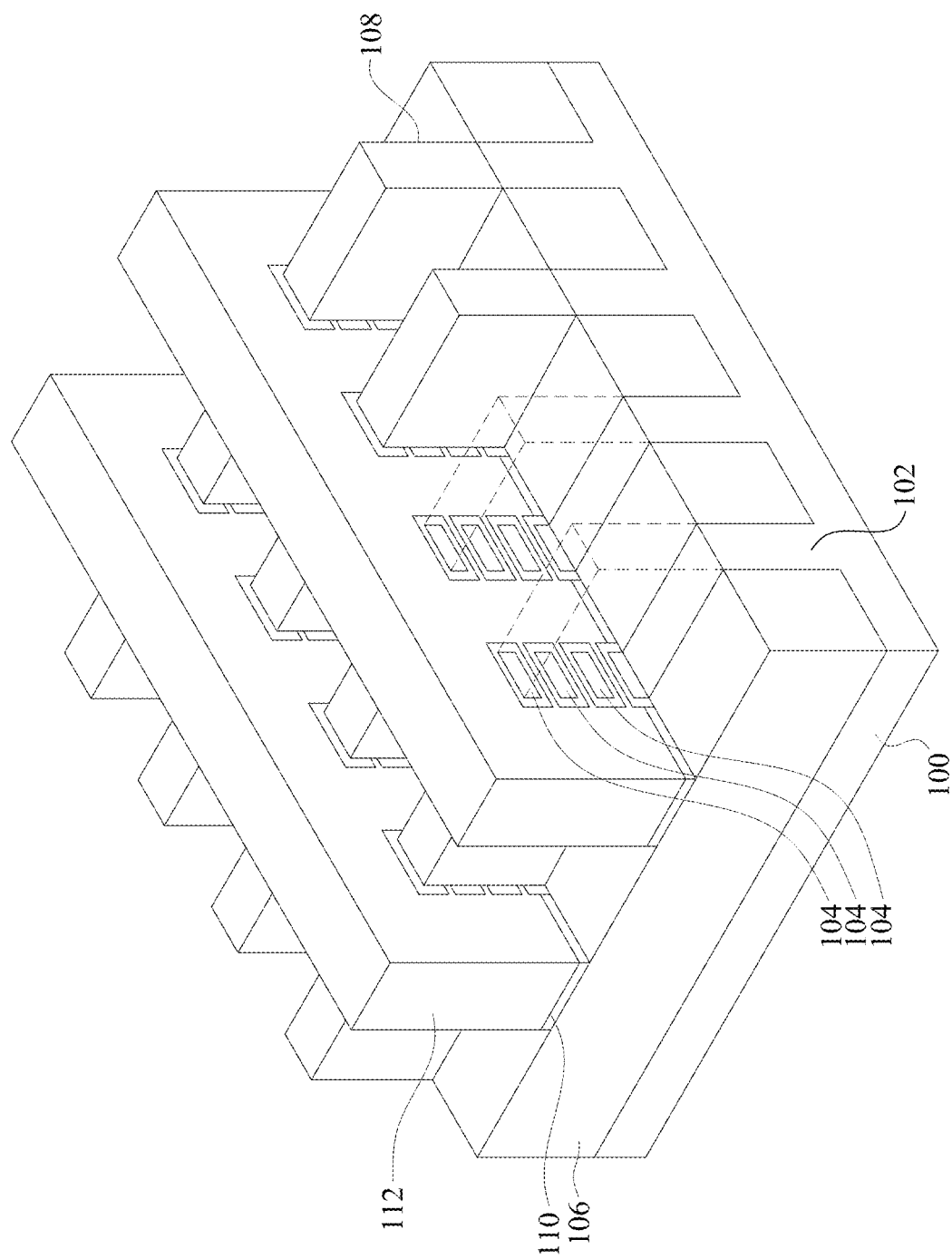
FIG. 1 illustrates an example of nano-FETs in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

As scales of the fin width in fin field effect transistors (FinFET) decreases, channel width variations might cause mobility loss. Nano-FETs (e.g., nanosheet FETs, nanowire FETs, or the like) are being studied as an alternative to fin field effect transistors. In a nano-FET, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

FIG. 1 illustrates an example of nano-FETs (e.g., nanosheet FETs or the like) in a three-dimensional view, in accordance with some embodiments. The nano-FETs comprise nanostructures 104 (e.g., nanosheets, nanowires, nanorings, nanoslabs, or other structures having nano-scale size (e.g., a few nanometers)) over fins 102 on a substrate 100 (e.g., a semiconductor substrate), wherein the nanostructures 104 act as channel regions for the GAA-FETs. The nanostructure 104 may include p-type nanostructures, n-type nanostructures, or a combination thereof. Isolation regions 106 are disposed between adjacent fins 102, which may protrude above and from between neighboring isolation regions 106. Although the isolation regions 106 are described/illustrated as being separate from the substrate 100, as used herein, the term "substrate" may refer to the semiconductor substrate alone or a combination of the semiconductor substrate and the isolation regions. Additionally, although a bottom portion of the fins 102 are illustrated as being single, continuous materials with the substrate 100, the bottom portion of the fins 102 and/or the substrate 100 may comprise a single material or a plurality of materials. In this context, the fins 102 refer to the portion extending between the neighboring isolation regions 106. Gate dielectrics 110 are over top surfaces of the fins 102 and along top surfaces, sidewalls, and bottom surfaces of the nanostructures 104. Gate electrodes 112 are over the gate dielectrics 110. Epitaxial source/drain regions 108 are disposed on the fins 102 on opposing sides of the gate dielectric layers 110 and the gate electrodes 112.

In various embodiments of the present disclosure, interbridge channels (interchangeably referred to as bridging channels, bridging portions or bridging structures in some embodiments of the present disclosure) are added between neighboring nanostructure channels, so as to improve on-current of nano-FETs. Moreover, in various embodiments of the present disclosure, the interbridge channels are localized to a periphery region or off-center region of the nanostructure channels, which can provide an improved on-current enhancement than forming the interbridge channels localized to a center region of the nanostructure channels.

Figure 2:
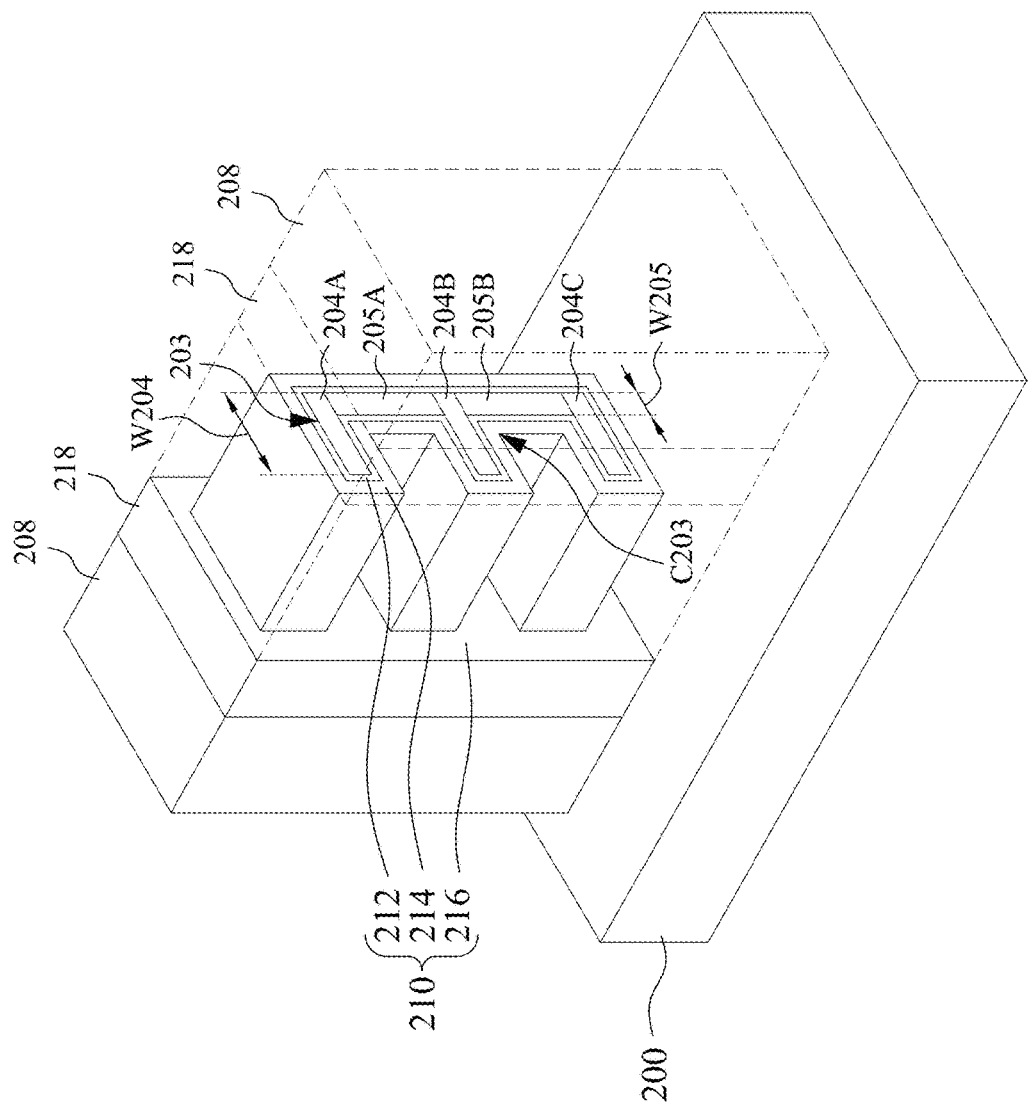
FIG. 2 illustrates an example of a nano-FET having off-center interbridge channels in a three-dimensional view, in accordance with some embodiments.

FIG. 2 illustrates an example of a nano-FET having off-center interbridge channels in a three-dimensional view, in accordance with some embodiments. The nano-FET comprises a channel structure 203 including alternating nanostructure channels 204A-C (collectively referred to as nanostructure channels 204) and interbridge channels 205A-205B (collectively referred to as interbridge channels 205) on a substrate 200. The substrate 200 may include fins and isolation regions disposed between the adjacent fins, as illustrated in FIG. 1. Epitaxial source/drain regions 208 are disposed on the substrate 200 on opposing sides of the channel structure 203. A gate structure 210 surrounds the channel structure 203, and is separated from the epitaxial source/drain regions 208 by gate spacers 218. The gate structure 210 includes, for example, a gate dielectric 212 over the channel structure 203, a work function metal layer 214 over the gate dielectric 212, and a fill metal 216 over the work function metal layer 214.

In the channel structure 203 the nanostructure channels 204 each have a width W204 in a direction perpendicular to a current flow between the epitaxial source/drain regions 208 (referred to as a current flow direction), and the interbridge channels 205 each have a width W205 in the current flow direction and smaller than the width W204 of the nanostructure channels 204. The interbridge channels 205 are localized to a periphery region of the nanostructure channels 204, rather than a center region of the nanostructure channels 204. In such a configuration, an interbridge channel 205 forms only a single concave corner C203 with a corresponding one of nanostructure channels 204. In contrast, if the interbridge channels 205 are localized to a center region of the nanostructure channels 204, an interbridge channel 205 would form two concave corners with a corresponding one of the nanostructure channels 204, as exemplarily illustrated in Condition #2 in FIG. 3. It is observed that concave corners in a channel structure may result in a weaker gate electric field (i.e., weaker gate control), which in turn may lead to less conducting charge carriers. Therefore, by localizing the interbridge channels 205 to the periphery region of the nanostructure channels 204, a number of concave corners in the channel structure 203 can be reduced by half, which in turn results in a stronger gate control and hence more conducting charge carriers, which in turn allows for further increasing in the on-current enhancement, as discussed in greater detail below.

Figure 3:
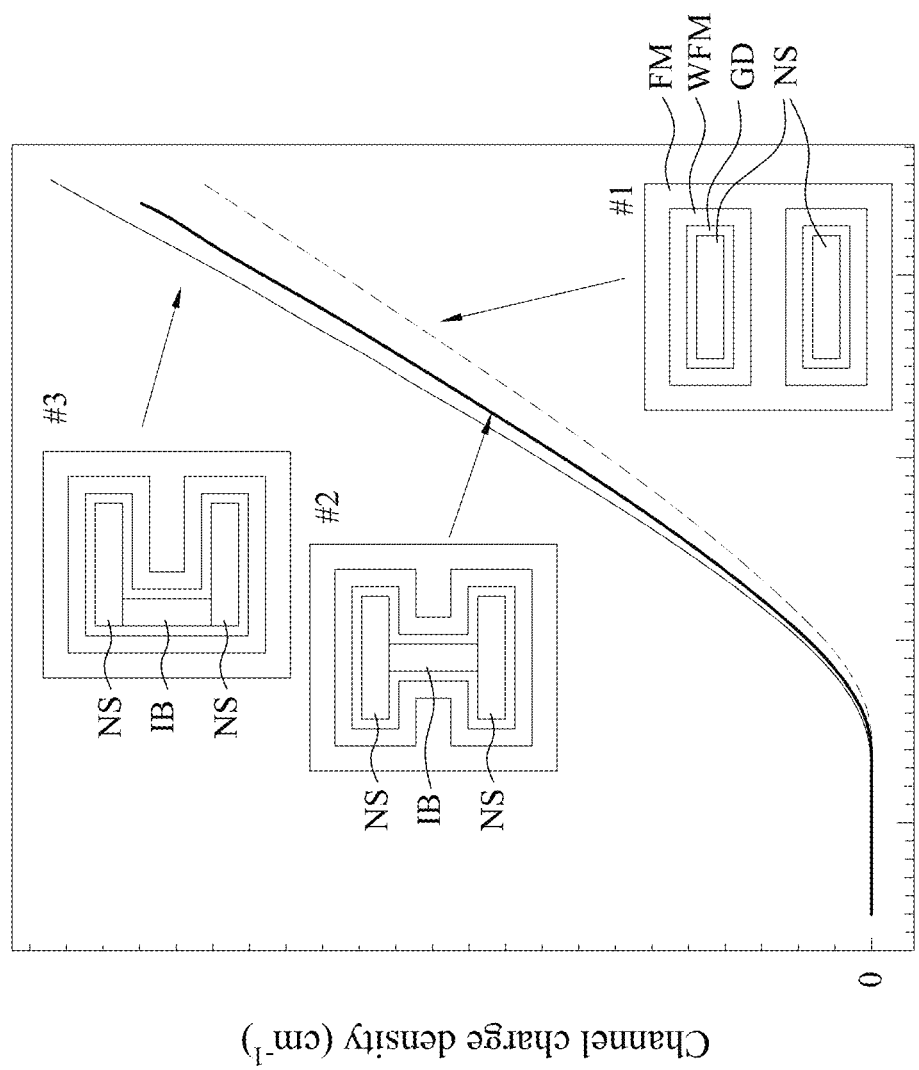
FIG. 3 illustrate simulation results showing channel charge density in different nano-FETs according to some embodiments of the present disclosure.

FIG. 3 illustrate simulation results showing channel charge density in different nano-FETs according to some embodiments of the present disclosure, wherein the channel charge density is shown on the vertical axis in FIG. 3, and the gate voltage is shown on the horizontal axis in FIG. 3. In Condition #1, the channel structure of the nano-FET includes two separated nanostructure channels NS without an interbridge channel therebetween. In Condition #2, the channel structure of the nano-FET includes two nano structure channels NS and an interbridge channel IB extending from a center region of a lower nanostructure channel to a center region of an upper nanostructure channel. In Condition #3, the channel structure of the nano-FET includes two nanostructure channels NS and an interbridge channel IB extending from a periphery region of a lower nanostructure channel to a periphery region of an upper nanostructure channel. In Conditions #1-3, the channel structures are surrounded by a gate structure including, for example, a gate dielectric GD, a work function metal WFM over the gate dielectric GD, and a fill metal FM over the work function metal WFM. Comparing the channel charge density curve of Condition #2 with the channel charge density curve of Condition #1, it can be observed that, at a same given non-zero gate voltage, the channel charge density of the nano-FET having an interbridge channel IB is greater than the channel charge density of the nano-FET without an interbridge channel. This simulation result shows that the interbridge channel provides on-current enhancement to nano-FETs. Comparing the channel charge density of Condition #3 with that of Condition #2, it can be observed that, at a same given non-zero gate voltage, the channel charge density of the nano-FET having the interbridge channel IB localized to the periphery regions of nanosheet channels NS is greater than the channel charge density of the nano-FET having the interbridge channel IB localized to the center regions of the nanosheet channels NS. This simulation result shows that the on-current enhancement can be further increased by forming the interbridge channel IB at peripheral regions of nanosheet channels NS.

Figure 4:
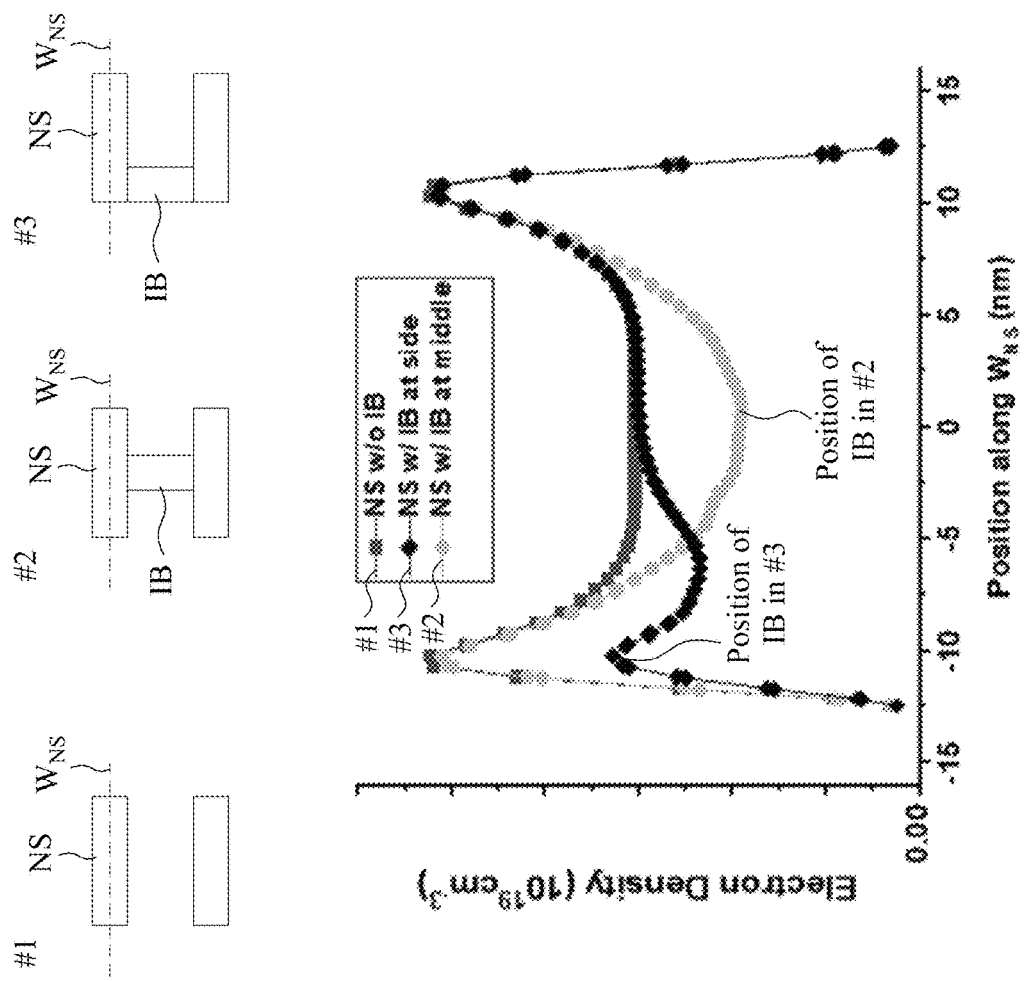
FIG. 4 illustrates simulation results showing electron density along a width direction of nanostructure channels in different nano-FETs according to some embodiments of the present disclosure.

FIG. 4 illustrates simulation results showing electron density along a width direction $W_{NS}$ of nanostructure channels NS in different nano-FETs according to some embodiments of the present disclosure, wherein the electron density is shown on the vertical axis in FIG. 4, and the position along the width direction $W_{NS}$ of nanostructure channels NS is shown on the horizontal axis in FIG. 4. In Condition #1, the channel structure of the nano-FET includes two separated nanostructure channels NS without an interbridge channel therebetween. In Condition #2, the channel structure of the nano-FET includes two nanostructure channels NS and an interbridge channel IB localized to center regions of the nanostructure channels NS. In Condition #3, the channel structure of the nano-FET includes two nanostructure channels NS and an interbridge channel IB localized to periphery regions of the nanostructure channels NS. Comparing the electron density curve of Conditions #1-#3, it can be observed that the interbridge channel IB causes electron density reduction, however, the interbridge channel IB localized to periphery regions of nanostructure channels NS results in a smaller electron density reduction than that localized to center regions of nanostructure channels NS.

Figure 5:
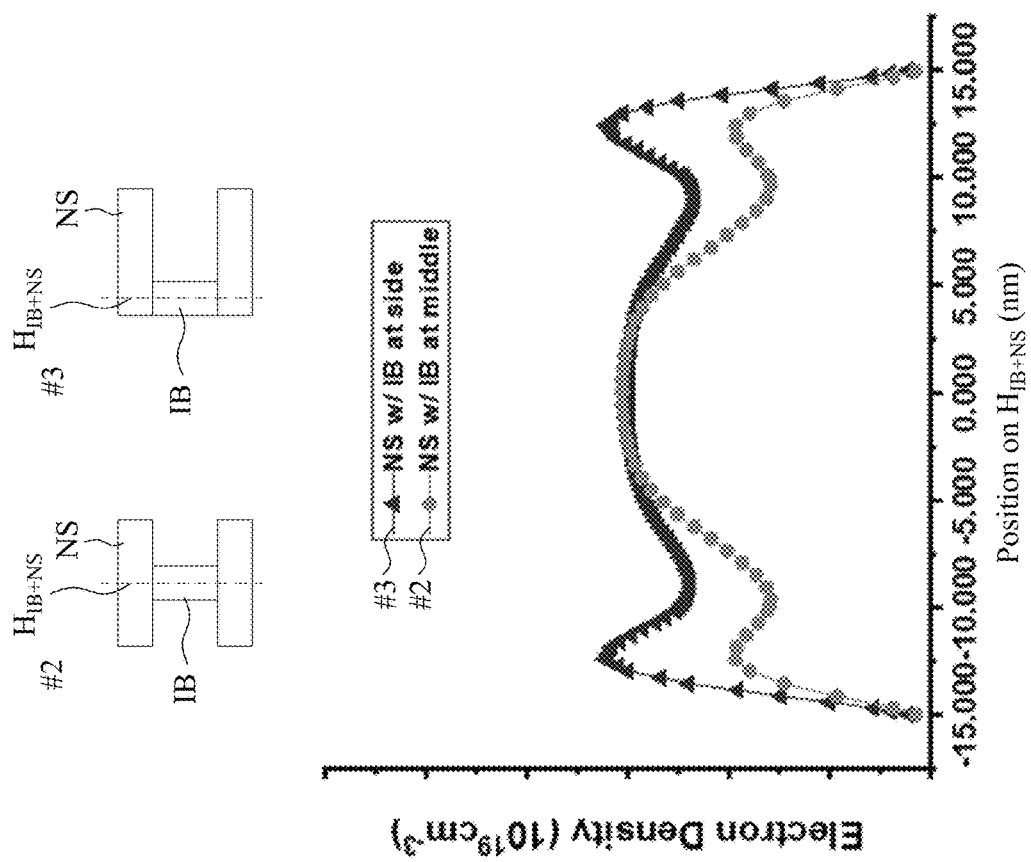
FIG. 5 illustrates simulation results showing electron density along a height direction of interbridge channels and nanostructure channels in different nano-FETs according to some embodiments of the present disclosure.
Figure 6B:
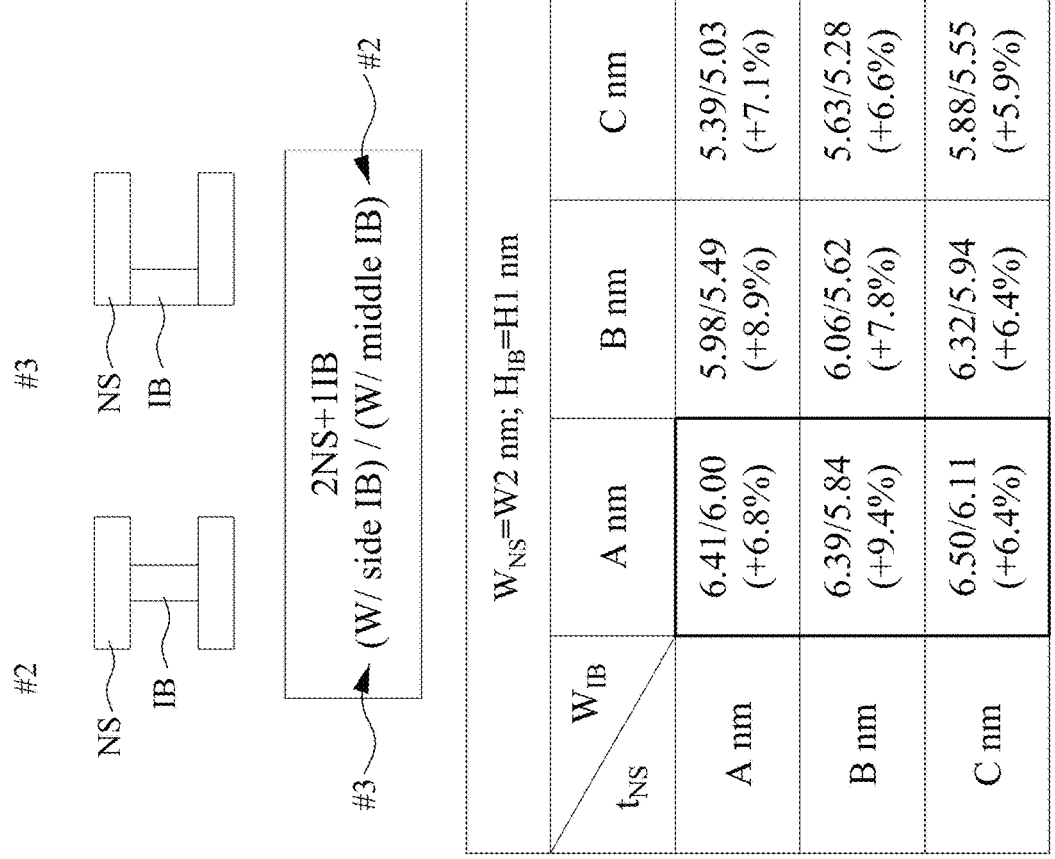
Figure 6C:
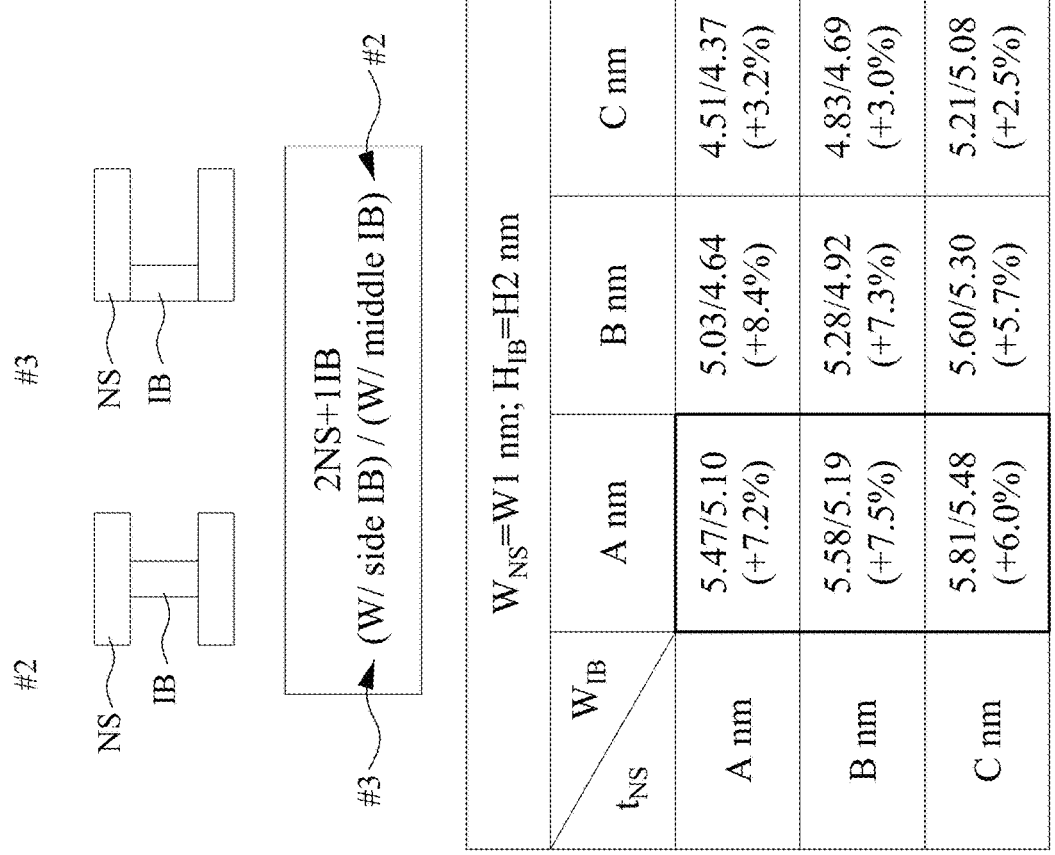
Figure 6D:
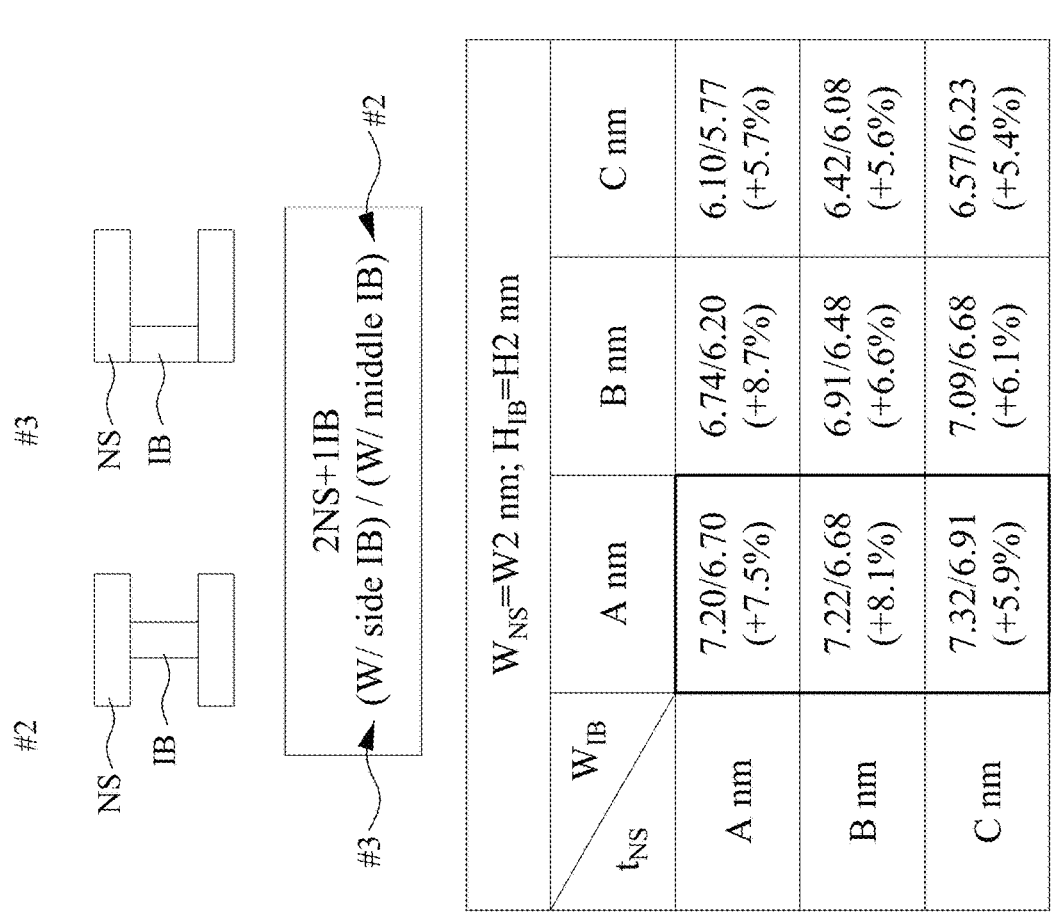
Figure 7A:
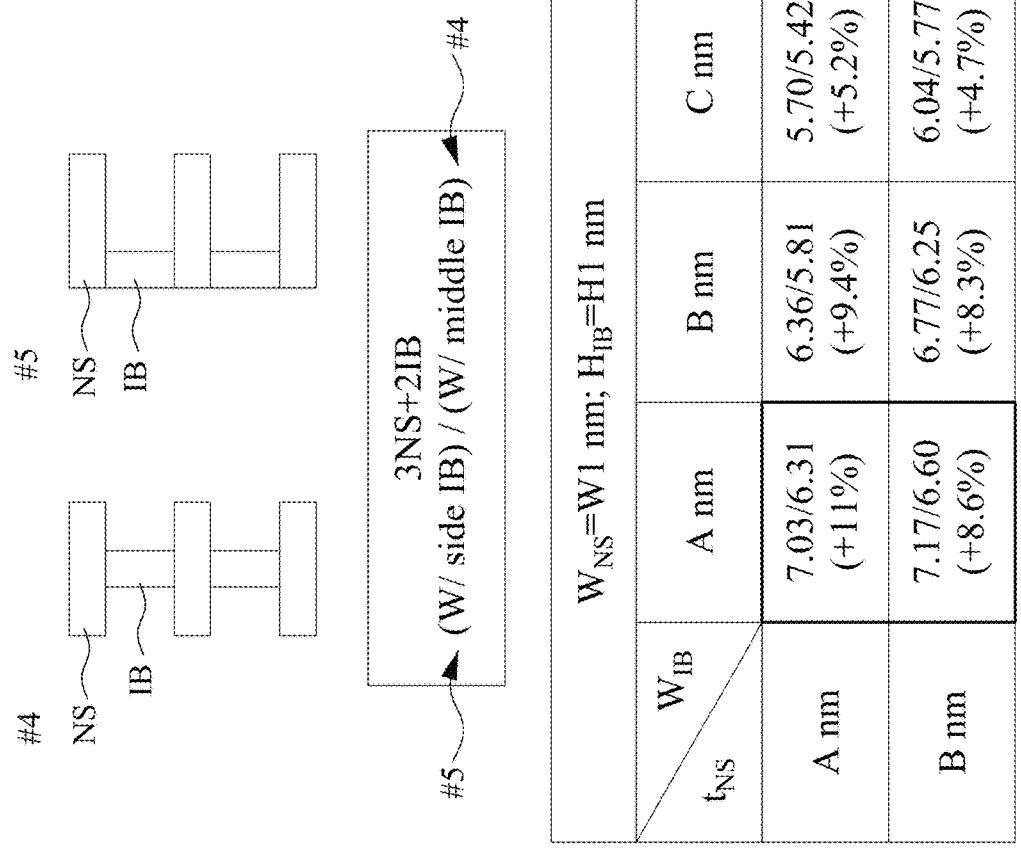
FIGS. 7A-7D are simulation results showing electron density improvement ratio between different nano-FETs according to some embodiments of the present disclosure.
Figure 7B:
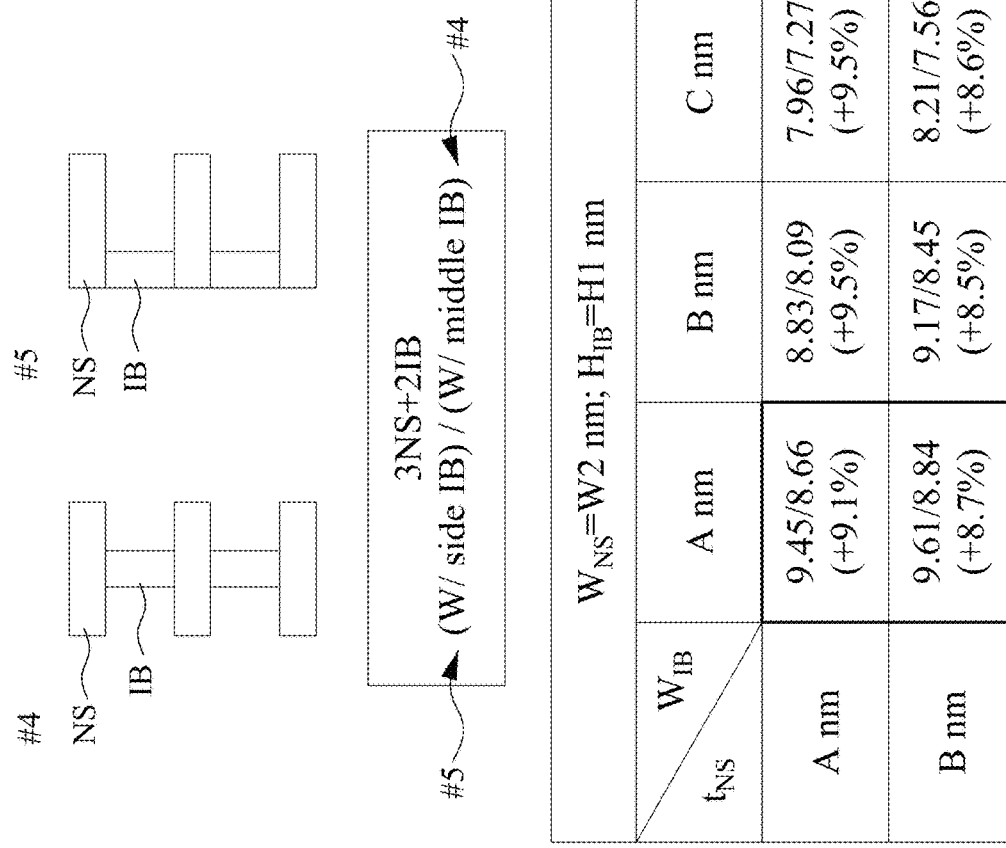
Figure 7C:
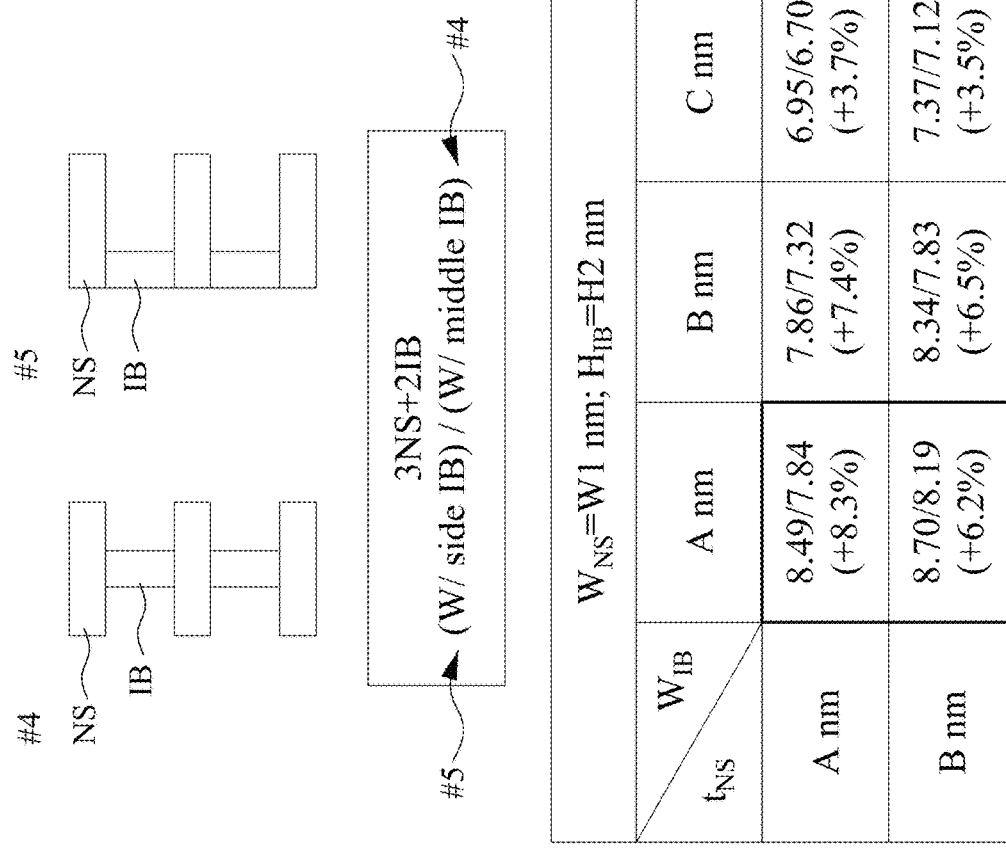
Figure 7D:
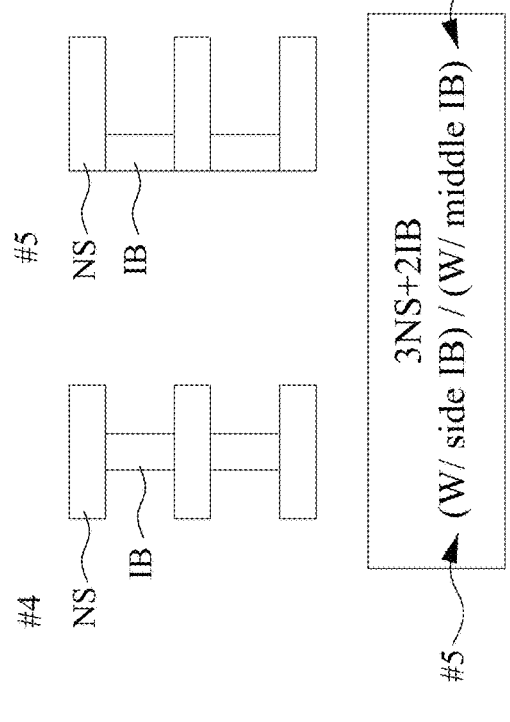

FIG. 5 illustrates simulation results showing electron density along a height direction $H_{IB+NS}$ of interbridge channels IB and nanostructure channels NS in different nano-FETs according to some embodiments of the present disclosure, wherein the electron density is shown on the vertical axis in FIG. 5, and the position along the height direction $H_{IB+NS}$ is shown on the horizontal axis in FIG. 5. Comparing the electron density curve of Condition #3 with that of Condition #2 in FIG. 5, it can be observed that the interbridge channel IB localized to periphery regions of nanostructure channels NS results in a higher electron density at opposite ends of the interbridge channel IB than that localized to center regions of nanostructure channels NS.

FIGS. 6A-6D are simulation results showing electron density improvement ratio of a nano-FET in Condition #3 to a nano-FET in Condition #2 according to some embodiments of the present disclosure, wherein $W_{IB}$ is a width of interbridge channels IB, $W_{NS}$ is a width of nanostructure channels NS, $t_{NS}$ is a thickness of nanostructure channels NS, and $H_{IB}$ is a height of interbridge channels IB. In some embodiments, W1 is in a range from about 14 nm to about 16 nm, e.g., about 15 nm; H1 is in a range from about 19 nm to about 21 nm, e.g., about 20 nm; W2 is in a range from about 24 nm to about 26 nm, e.g., about 25 nm; H2 is in a range from about 29 nm to about 31 nm, e.g., about 30 nm. In some embodiments, A nm is less than B nm, and B nm is less than C nm. By way of example and not limitation, A nm is in a range from about 4 nm to about 6 nm, e.g., about 5 nm; B nm is in a range from about 6 nm to about 8 nm, e.g., about 7 nm; and C nm is in a range from about 9 nm to about 11 nm, e.g., about 10 nm.

In Condition #2 the channel structure of the nano-FET includes two nanostructure channels NS and one interbridge channel IB localized to center regions of the nanostructure channels NS, and in Condition #3 the channel structure of the nano-FET includes two nanostructure channels NS and one interbridge channel IB localized to periphery regions of the nanostructure channels NS. Simulation results in FIGS. 6A-6D show that the narrower the interbridge channel width $W_{IB}$, the more carriers are generated in the nano-FETs. Simulation results in FIGS. 6A-6D further show that the interbridge channel IB localized to periphery regions of nanostructure channels NS results in higher electron density in the channel structure than that localized to center regions of nanostructure channels NS. Simulation results in FIGS. 6A-6D also show that the thicker the nanostructure channel thickness $t_{NS}$, the more carriers are generated in the nano-FETs, due to an increased effective transistor gate width ($W_{eff}$) resulting from the thickened nanostructure channels.

FIGS. 7A-7D are simulation results showing electron density improvement ratio of a nano-FET in Condition #5 to a nano-FET in Condition #4 according to some embodiments of the present disclosure, wherein $W_{IB}$ is a width of interbridge channels, $W_{NS}$ is a width of nanostructure channels, $t_{NS}$ is a thickness of nanostructure channels, and $H_{IB}$ is a height of interbridge channels. In some embodiments, W1 is in a range from about 14 nm to about 16 nm, e.g., about 15 nm; H1 is in a range from about 19 nm to about 21 nm, e.g., about 20 nm; W2 is in a range from about 24 nm to about 26 nm, e.g., about 25 nm; H2 is in a range from about 29 nm to about 31 nm, e.g., about 30 nm. In some embodiments, A nm is less than B nm, and B nm is less than C nm. By way of example and not limitation, A nm is in a range from about 4 nm to about 6 nm, e.g., about 5 nm; B nm is in a range from about 6 nm to about 8 nm, e.g., about 7 nm; and C nm is in a range from about 9 nm to about 11 nm, e.g., about 10 nm.

In Condition #4 the channel structure of the nano-FET includes alternating three nanostructure channels NS and two interbridge channel IB localized to center regions of the nanostructure channels NS, and in Condition #5 the channel structure of the nano-FET includes alternating three nanostructure channels NS and two interbridge channel IB localized to periphery regions of the nanostructure channels NS. Simulation results in FIGS. 7A-7D show that the interbridge channels IB localized to periphery regions of nanostructure channels NS result in an improvement in channel electron density by about 5% to about 12%, as compared to that localized to center regions of nanostructure channels NS.

In some embodiments, the interbridge channel width $W_{IB}$ of the interbridge channels IB is in a range from about 2 nm to about 10 nm. If the interbridge channel width $W_{IB}$ is excessively large (e.g., larger than about 10 nm), a longer transistor gate length may be employed for avoiding short channel effects, which in turn may cause a negative impact on device down-scaling. If the interbridge channel width $W_{IB}$ is excessively small (e.g., smaller than about 2 nm), surface roughness on sidewalls of the interbridge channels may be increased, which in turn may cause mobility degradation and reduce the on-current provided by the interbridge channels. In some embodiments, the interbridge channel height $H_{IB}$ of the interbridge channels IB in a range from about 10 nm to about 200 nm. If the interbridge channel height $H_{IB}$ is excessively small (e.g., smaller than about 10 nm), the interbridge channels may provide insufficient on-current enhancement. If the interbridge channel height $H_{IB}$ is excessively large (e.g., larger than about 200 nm), the increased device vertical footprint may increase the gate parasitic capacitance and thus degrade the device performance. Moreover, if the interbridge channel height $H_{IB}$ is excessively large (e.g., larger than about 200 nm), it may be challenging to form the overly high interbridge channels by etching process, which will be described in greater detail below.

Figure 8A:
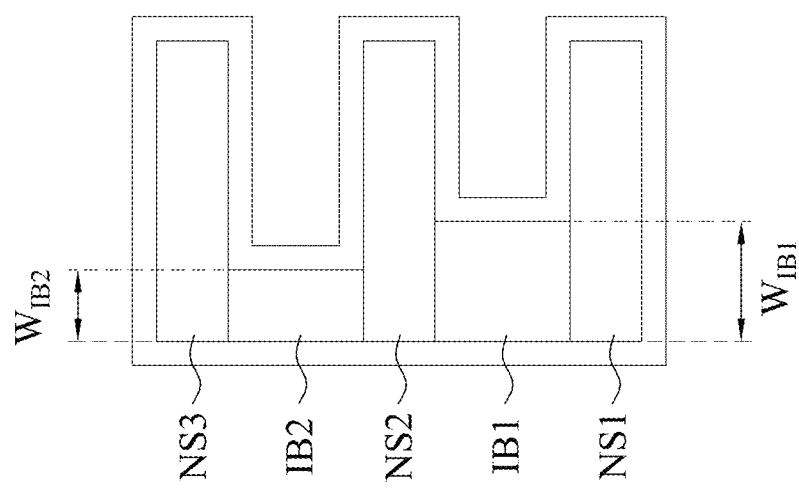
FIG. 8A illustrates a cross-sectional view of a channel structure having interbridge channels with different widths according to some embodiments of the present disclosure.

Although the interbridge channels in the channel structure in Conditions #4-5 are illustrated as having substantially the same width, the interbridge channels may have different widths in some other embodiments. FIG. 8A illustrates a cross-sectional view of a channel structure having interbridge channels with different widths. In FIG. 8A, the channel structure includes alternating nanostructure channels NS1-NS3 and interbridge channels IB1 and IB2 surrounded by a gate structure. The interbridge channel IB2 is disposed above the interbridge channel IB1 and has a width $W1_{IB2}$ smaller than a width $W_{IB1}$ of the interbridge channel IB1. Width difference between interbridge channels may affect the electron density in the channel structure, as illustrated in FIG. 8B, which shows simulation results of electron density in nano-FETs having various interbridge channel width differences, in accordance with some embodiments of the present disclosure. In FIG. 8B, $W_{NS}$ is a width of nanostructure channels NS1-NS3, $t_{NS}$ is a thickness of nanostructure channels NS1-NS3, and $H_{IB}$ is a height of interbridge channels IB1 and IB2. In some embodiments, W1 is in a range from about 14 nm to about 16 nm, e.g., about 15 nm; H1 is in a range from about 19 nm to about 21 nm, e.g., about 20 nm. In some embodiments, A nm is less than B nm, and B nm is less than C nm. By way of example and not limitation, A nm is in a range from about 4 nm to about 6 nm, e.g., about 5 nm; B nm is in a range from about 6 nm to about 8 nm, e.g., about 7 nm; and C nm is in a range from about 9 nm to about 11 nm, e.g., about 10 nm.

As illustrated in FIG. 8B, when the lower interbridge channel width $W_{IB1}$ is C nm (e.g., about 10 nm), the less the upper interbridge channel width $W_{IB2}$, the higher the electron density. On the other hand, when the upper interbridge channel width $W_{IB2}$ is A nm (e.g., about 5 nm), the less the lower interbridge channel width $W_{IB1}$, the higher the electron density.

Figure 9A:
FIG. 9A shows simulation results showing on-current improvement ratio, sub-threshold swing (SS) improvement ratio, and an improvement in on-current/off-current ratio between different nano-FETs, in accordance with some embodiments of the present disclosure.
Figure 9B:
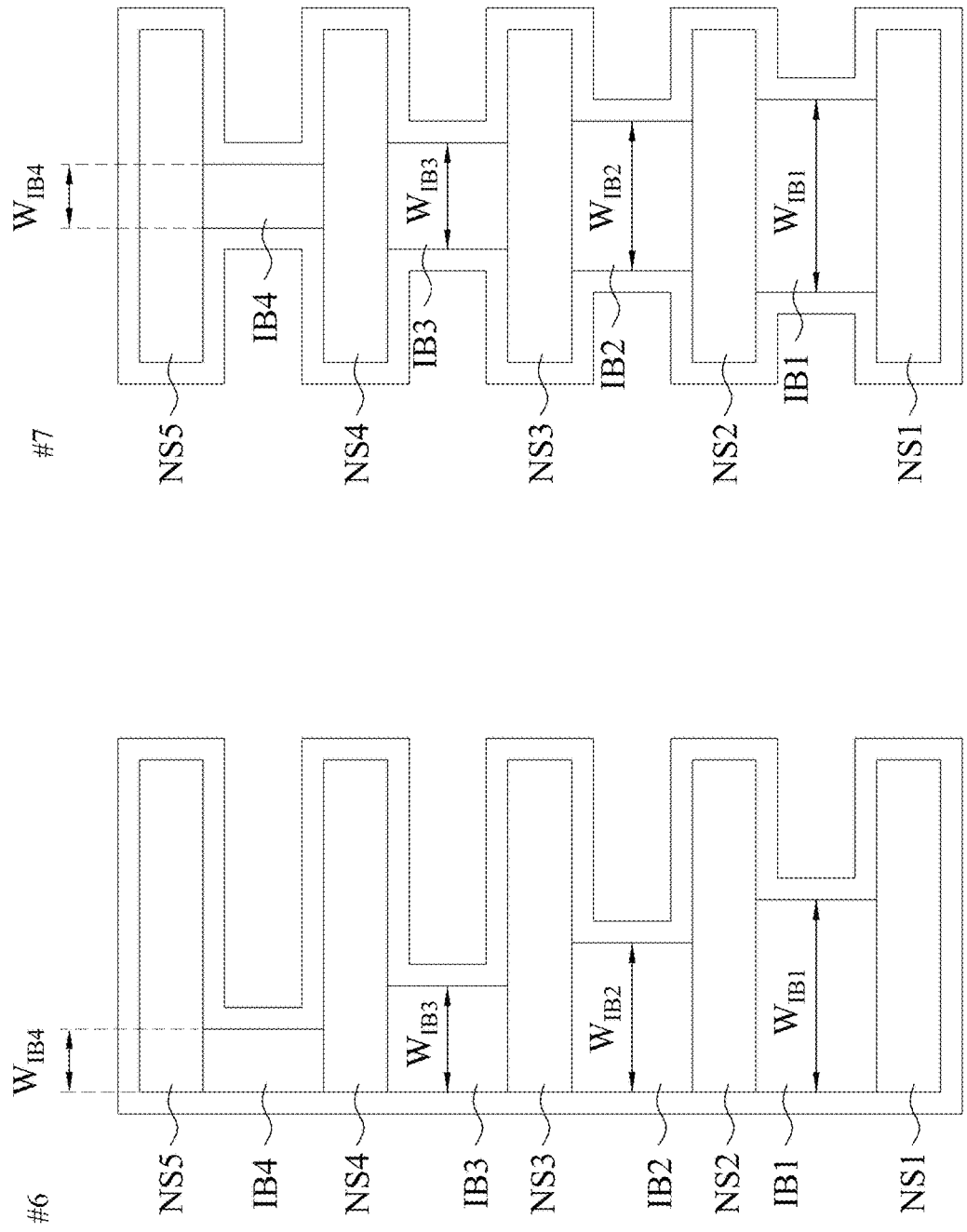
FIG. 9B illustrates channel structures of the nano-FETs of FIG. 9A.

FIG. 9A shows simulation results showing on-current improvement ratio, sub-threshold swing (SS) improvement ratio, and an improvement in on-current/off-current ratio of a nano-FET in Condition #6 to a nano-FET in Condition #7. In Condition #6, as illustrated in FIG. 9B, the channel structure of the nano-FET includes alternating five nanostructure channels NS1-NS5 and four interbridge channels IB1-IB4 localized to periphery regions of the nanostructure channels NS1-NS5. In Condition #7, as illustrated in FIG. 9B, the channel structure of the nano-FET includes alternating five nanostructure channels NS1-NS5 and four interbridge channels IB1-IB4 localized to center regions of the nanostructure channels NS1-NS5. The interbridge channels IB1-IB4 have widths $W_{IB1}$, $W_{IB2}$, $W_{IB3}$, and $W_{IB4}$, respectively. In FIG. 9A, $\Delta IB$ can be expressed as: $\Delta W_{IB} = W_{IBn-1} - W_{IBn}$, e.g., $W_{IB1} - W_{IB2}$, $W_{IB2} - W_{IB3}$, or $W_{IB3} - W_{IB4}$. In some embodiments, W2 is in a range from about 24 nm to about 26 nm, e.g., about 25 nm; H1 is in a range from about 19 nm to about 21 nm, e.g., about 20 nm; A nm is in a range from about 4 nm to about 6 nm, e.g., about 5 nm; D nm is in a range from about 0.5 nm to about 1.5 nm, e.g., about 1 nm; and E nm is in a range from about 1.5 nm to about 2.5 nm, e.g., about 2 nm.

On-current simulation results in FIG. 9A show that increasing in interbridge channel width difference ($\Delta W_{IB}$) results in increased on-current ($I_{on}$) in both Conditions #6 and #7. FIG. 9A further shows that the interbridge channels IB1-IB4 localized to periphery regions of nanostructure channels NS1-NS5 (i.e., Condition #6) can provide a higher on-current than that localized to center regions of nanostructure channels NS1-NS5 (i.e., Condition #7), regardless of the interbridge channel width difference.

Sub-threshold swing simulation results in FIG. 9A show that increasing in interbridge channel width difference results in increased sub-threshold swing (SS) in both Conditions #6 and #7. FIG. 9A further shows that the interbridge channels IB1-IB4 localized to periphery regions of nanostructure channels NS1-NS5 (i.e., Condition #6) can provide a higher SS than that localized to center regions of nanostructure channels NS1-NS5 (i.e., Condition #7), regardless of the interbridge channel width difference.

$I_{on}/I_{off}$ ratio simulation results in FIG. 9A show that the interbridge channels IB1-IB4 localized to periphery regions of nanostructure channels NS1-NS5 (i.e., Condition #6) can provide a higher $I_{on}/I_{off}$ ratio than that localized to center regions of nanostructure channels NS1-NS5 (i.e., Condition #7), regardless of the interbridge channel width difference. FIG. 9A further shows that increasing in interbridge channel width difference results in a degraded $I_{on}/I_{off}$ ratio in both Conditions #6 and #7. This may be attributed to an unduly large width in the bottom interbridge channel IB1. The unduly wide interbridge channel IB1 may be attributed to under-etching during SiGe selective etching for forming the interbridge channels. By localizing the interbridge channels to periphery regions of the nanostructure channels, interbridge channel width difference can be reduced by half, as compared to localizing the interbridge channels to center regions of the nanostructure channels, because only single side of the interbridge channels is etched, which will be discussed in greater detail below. As a result, it is easier to control the interbridge channel width difference by localizing the interbridge channels to periphery regions of nanostructure channels, which in turn aids in prevent an unduly large width in the bottom interbridge channel IB1. In some embodiments, the interbridge channel width difference ($\Delta W_{IB}$) is less than about 10 nm. Excessively large interbridge channel width (e.g., greater than about 10 nm) may result in increased short channel effects.

FIGS. 10A-22B are top views and cross-sectional views of intermediate stages in the manufacturing of a nano-FET, in accordance with some embodiments of the present disclosure. It is understood that additional operations can be provided before, during, and after processes shown by FIGS. 10A-22B, and some of the operations described below can be replaced or eliminated, for additional embodiments of the method. The order of the operations/processes may be interchangeable.

Figure 10A:
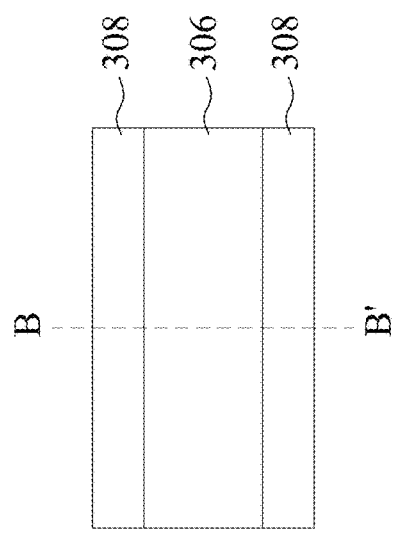
Figure 10B:
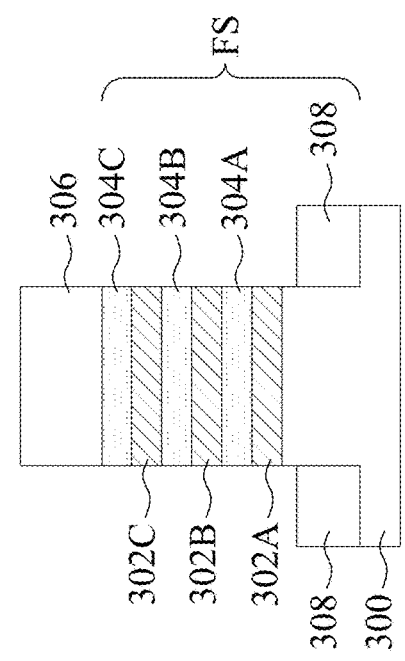

FIG. 10A is a top view of an intermediate stage in manufacturing of a nano-FET, and FIG. 10B is a cross-sectional view corresponding to the line B-B' illustrated in FIG. 10A. In FIGS. 10A and 10B, a semiconductor substrate 300 is illustrated. In some embodiments, the substrate 300 may be a semiconductor substrate, such as a bulk semiconductor substrate, a semiconductor-on-insulator (SOI) substrate, a multi-layered or gradient substrate, or the like. The substrate 300 may include a semiconductor material, such as an elemental semiconductor including Si and Ge; a compound or alloy semiconductor including SiC, SiGe, GeSn, GaAs, GaP, GaAsP, AlInAs, AlGaAs, GaInAs, InAs, GaInP, InP, InSb, GaInAsP; a combination thereof, or the like. The substrate 100 may be doped or substantially un-doped. In a specific example, the substrate 100 is a bulk silicon substrate, which may be a wafer.

The substrate 300 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP.

Impurity ions (interchangeably referred to as dopants) are implanted into the silicon substrate 300 to form a well region (not shown). The ion implantation is performed to prevent a punch-through effect. The substrate 300 may include various regions that have been suitably doped with impurities (e.g., p-type or n-type conductivity). The dopants are, for example, boron ($BF_2$) for an n-type nano-FET and phosphorus for a p-type nano-FET.

FIGS. 10A and 10B also illustrate a layer stack is formed over the substrate 300. A first semiconductor layer (first interbridge layer) 302A is formed over the substrate 300. A second semiconductor layer (first nanostructure layer) 304A is formed over the first semiconductor layer 302A. Another first semiconductor layer (second interbridge layer) 302B is formed over the second semiconductor layer 304A. Another second semiconductor layer (second nanostructure layer) 304B is formed over the another first semiconductor layer 302B. Another first semiconductor layer (third interbridge layer) 302C is formed over the second semiconductor layer 304B. Another second semiconductor layer (third nanostructure layer) 304C is formed over the first semiconductor layer 302C.

In some embodiments, the first and second semiconductor layers are alternately stacked such that there are more than two layers each of the first and second semiconductor layers. In some embodiments, each of the second semiconductor layers, which become nanosheets, nanowires, nanoslabs or nanorings, can be formed of different materials. In some embodiments, the lattice constant of the second semiconductor layers is greater than the lattice constant of the first semiconductor layers. In other embodiments, the lattice constant of the second semiconductor layers is smaller than the lattice constant of the first semiconductor layers.

In some embodiments, the first and second semiconductor layers are made of different materials selected from the group consisting of Si, Ge, SiGe, GeSn, Si/SiGe/Ge/GeSn, SiGeSn, and combinations thereof. In some embodiments, the first and second semiconductor layers are formed by epitaxy. In some embodiments, the SiGe is $Si_{1-x}Ge_x$, where $0.1 \leq x \leq 0.9$.

In some embodiments, the first semiconductor layers 302A-302C (collectively referred to as first semiconductor layers 302) are formed of a first semiconductor material. In some embodiments, the first semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In certain embodiments, the first semiconductor material is $Si_{1-x}Ge_x$, wherein $0.1 \leq x \leq 0.9$. In some embodiments, the first semiconductor layers 302 have different germanium atomic concentrations. For example, the bottommost first semiconductor layer 302A may have a higher germanium concentration than upper first semiconductor layers 302B and 302C, which in turn allows for removing the bottommost first semiconductor layer 302A while leaving portions of upper first semiconductor layers 302B and 302C to serve as interbridge channels in a following SiGe selective etching process. In some embodiments, the topmost first semiconductor layer 302C has a higher germanium concentration than the middle first semiconductor layer 302B, which in turn allows for forming a wider interbridge channel between nanostructure layers 302B and 302C, and a narrower interbridge channel above the nanostructure layer 302C in the following SiGe selective etching process.

In some embodiments, the second semiconductor layers 304A-304C (collectively referred to as second semiconductor layers 304) are formed of a second semiconductor material. In some embodiments, the second semiconductor material is silicon. Stated another way, the second semiconductor material is substantially free of germanium in some embodiments. In some embodiments, the second semiconductor material includes a first Group IV element and a second Group IV element. In some embodiments, the first Group IV element is Si and the second Group IV element is Ge. In some embodiments, the amounts of the first Group IV element and second Group IV element are different in the second semiconductor material than in the first semiconductor material. In some embodiments, the amount of Ge in the first semiconductor material is greater than the amount of Ge in the second semiconductor material. In some other embodiments, the second semiconductor material includes a Group III element and a Group V element.

The first semiconductor layers 302 and second semiconductor layers 304 may be formed by one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy (MBE), and/or other suitable processes. Thickness of the first semiconductor layers 302 depends on a target interbridge channel height. For example, the thickness of first semiconductor layers 302 is in a range from about 10 nm to about 200 nm. If the thickness of first semiconductor layers 302 is excessively small (e.g., smaller than about 10 nm), the resulting interbridge channels may provide insufficient on-current enhancement. If the thickness of first semiconductor layers 302 is excessively large (e.g., larger than about 200 nm), the increased device vertical footprint may increase the gate parasitic capacitance and thus degrade the device performance. Moreover, if the thickness of first semiconductor layers 302 is excessively large (e.g., larger than about 200 nm), it may be challenging to form the overly high interbridge channels by a following SiGe selective etching process.

In some embodiments, the thickness of the second semiconductor layers 304 is less than the thickness of the first semiconductor layers 302. For example, the thickness t1 of the first semiconductor layers 302 and the thickness t2 of the second semiconductor layers 304 are related as t1/t2=2 to 20.

After the epitaxial growth process of the layer stack is complete, a patterned mask 306 is formed over the topmost second semiconductor layer 304C. The second semiconductor layer 304C, followed by patterning the mask layer into the patterned mask 306 using suitable photolithography and etching techniques. The patterned mask 306 includes silicon nitride ($Si_3N_4$), silicon oxide, the like, or combinations thereof.

After forming the patterned mask 306, a patterning process is performed on the layer stack to form a fin structure FS, as illustrated in FIGS. 10A and 10B. In some embodiments, the patterning process comprises one or more etching processes, where the patterned mask layer 306 is used as an etch mask. The one or more etching processes may include wet etching processes, anisotropic dry etching processes, or combinations thereof, and may use one or more etchants that etch the first and second semiconductor layers 302, 304 at a faster etch rate than it etches the patterned mask layer 306. Although the fin structure FS illustrated in FIG. 10B has vertical sidewalls, the etching process may lead to tapered sidewalls in some other embodiments.

Once the fin structure FS has been formed, shallow trench isolation (STI) regions 308 (interchangeably referred to as isolation insulation layer) are formed around a lower portion of the fin structure FS are illustrated in FIGS. 10A and 10B. STI regions 308 may be formed by depositing one or more dielectric materials (e.g., silicon oxide) to completely fill the trenches around the fin structures FS and then recessing the top surface of the dielectric materials. The dielectric materials of the STI regions 308 may be deposited using a high density plasma chemical vapor deposition (HDP-CVD), a low-pressure CVD (LPCVD), sub-atmospheric CVD (SACVD), a flowable CVD (FCVD), spin-on coating, and/ or the like, or a combination thereof. After the deposition, an anneal process or a curing process may be performed. In some cases, the STI regions 308 may include a liner such as, for example, a thermal oxide liner grown by oxidizing the silicon surface or silicon germanium surface of the fin structure FS and the substrate 100. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI regions 308 such that an upper portion of the fin structure FS protrudes from surrounding insulating STI regions 308.

Figure 11A:
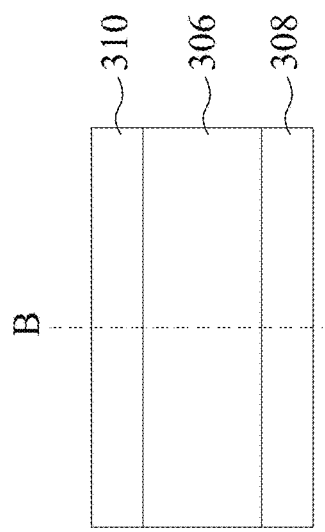
Figure 11B:
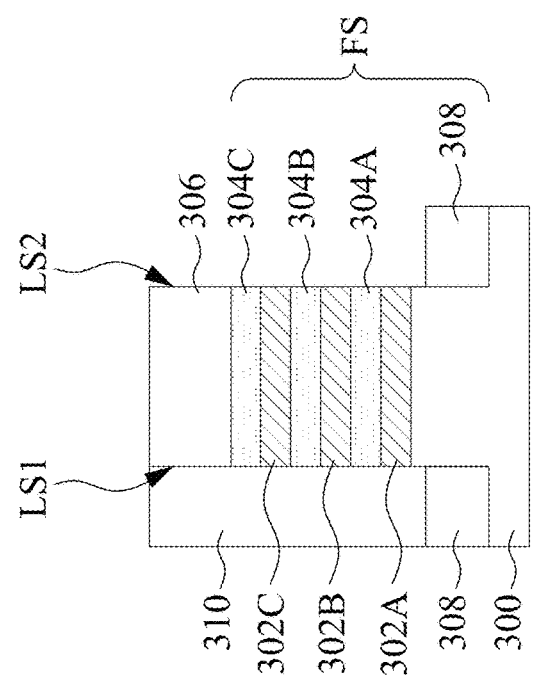

FIG. 11A is a top view of an intermediate stage in manufacturing of a nano-FET, and FIG. 11B is a cross-sectional view corresponding to the line B-B' illustrated in FIG. 11A. In FIGS. 11A and 11B, a dielectric wall 310 is formed on a first longitudinal side LS1 of the fin structure FS but not on a second longitudinal side LS2 of the fin structure FS opposing the first longitudinal side LS1. The dielectric wall 310 can be formed by, for example, depositing a dielectric layer over the substrate 300, followed by patterning the dielectric layer into the dielectric wall 310 using suitable photolithography and etching techniques. For example, a photoresist material is first spin-coated on the dielectric layer, and then irradiated (exposed) and developed to remove portions of the photoresist material. Then, the dielectric layer is etched using the patterned photoresist as an etch mask. The etching step may be dry etching, wet etching, or combinations thereof. In an example photolithography step, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used. In some embodiments, the dielectric wall 310 includes silicon oxide, silicon nitride, silicon oxynitride, and/or other suitable dielectric materials.

FIG. 12A is a top view of an intermediate stage in manufacturing of a nano-FET, FIG. 12B is a cross-sectional view corresponding to the line B-B' illustrated in FIG. 12A, and FIG. 12C is a cross-sectional view corresponding to the line C-C' illustrated in FIG. 12A. In FIGS. 12A-12C, once the dielectric wall 310 has been formed, a dummy gate structure 312 is formed over the fin structure FS. The dummy gate structure 312 has a lengthwise direction perpendicular to the lengthwise direction of the fin structure FS. The dummy gate structure 312 includes a dummy gate dielectric layer and a dummy gate electrode layer over the dummy gate dielectric layer. The dummy gate dielectric layer may be, for example, silicon oxide, silicon nitride, a combination thereof, or the like, and may be deposited or thermally grown according to acceptable techniques. The dummy gate electrode layer can be deposited over the dummy dielectric layer and then planarized, such as by a CMP process. The dummy gate electrode layer may be a conductive or non-conductive material and may be selected from a group including amorphous silicon, polycrystalline-silicon (poly silicon), polycrystalline silicon-germanium (poly-SiGe), metallic nitrides, metallic silicides, metallic oxides, and metals. The dummy gate electrode layer may be deposited by physical vapor deposition (PVD), CVD, sputter deposition, or the like. The dummy gate dielectric layer and the dummy gate electrode layer are patterned to form the dummy gate structure 312. In some embodiments, the fin mask 306 is removed from the topmost second semiconductor layer 304C before forming the dummy gate structure 312.

FIGS. 12A-12C also illustrate formation of gate spacers 314 on sidewalls of the dummy gate structure 312. In some embodiments of the spacer formation step, a spacer material layer is deposited on the substrate 300. The spacer material layer may be a conformal layer that is subsequently etched back to form gate sidewall spacers. In the illustrated embodiment, a spacer material layer 314 is disposed conformally on top and sidewalls of the dummy gate structure 312. The spacer material layer 314 may include a dielectric material such as silicon oxide, silicon nitride, silicon carbide, silicon oxynitride, SiCN films, silicon oxycarbide, SiOCN films, and/or combinations thereof. The spacer material layer 314 may be formed by depositing a dielectric material over the gate structure 312 using processes such as, CVD process, a subatmospheric CVD (SACVD) process, a flowable CVD process, an ALD process, a PVD process, or other suitable process. An anisotropic etching process is then performed on the deposited spacer material layer 314 to expose portions of the fin structure FS not covered by the dummy gate structure 312 (e.g., in source/drain regions of the fin structure FS). Portions of the spacer material layer directly above the dummy gate structure 312 may be completely removed by this anisotropic etching process. Portions of the spacer material layer on sidewalls of the dummy gate structure 312 may remain, forming gate sidewall spacers, which is denoted as the gate spacers 314, for the sake of simplicity.

FIG. 13A is a top view of an intermediate stage in manufacturing of a nano-FET, FIG. 13B is a cross-sectional view corresponding to the line B-B' illustrated in FIG. 13A, FIG. 13C is a cross-sectional view corresponding to the line C-C' illustrated in FIG. 13A, and FIG. 13D is a cross-sectional view corresponding to the line D-D' illustrated in FIG. 13A. In FIGS. 13A-13D, exposed portions of the fin structure FS that extend laterally beyond the gate spacers 314 (e.g., in source/drain regions of the fin structure FS) are recessed by using, for example, an anisotropic etching process that uses the dummy gate structure 312 and the gate spacers 314 as an etch mask. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

FIG. 14A is a top view of an intermediate stage in manufacturing of a nano-FET, FIG. 14B is a cross-sectional view corresponding to the line B-B' illustrated in FIG. 14A, FIG. 14C is a cross-sectional view corresponding to the line C-C' illustrated in FIG. 14A, and FIG. 14D is a cross-sectional view corresponding to the line D-D' illustrated in FIG. 14A. In FIGS. 14A-14D, an interbridge mask 316 is formed on a sidewall of the dielectric wall 310 and over the recessed portion of the fin structure (e.g., in source/drain regions of the fin structure). The interbridge mask 316 can be formed by, for example, depositing a dielectric layer over the structure as illustrated in FIGS. 13A-13D, followed by an anisotropic etching process to remove horizontal portions of the dielectric layer while leaving a vertical portion on the sidewall of the dielectric wall 310 to serve as the interbridge mask 316.

FIG. 15A is a top view of an intermediate stage in manufacturing of a nano-FET, FIG. 15B is a cross-sectional view corresponding to the line B-B' illustrated in FIG. 15A, FIG. 15C is a cross-sectional view corresponding to the line C-C' illustrated in FIG. 15A, and FIG. 15D is a cross-sectional view corresponding to the line D-D' illustrated in FIG. 15A. In FIGS. 15A-15D, a selective etching process is performed to selectively etch the first semiconductor layers 302 exposed at outer sidewalls of the gate spacers 314. This etching step forms a sidewall recess 319A below the second semiconductor layer 304A, a sidewall recess 319B between the second semiconductor layers 304A and 304B, and a sidewall recess 319C between the second semiconductor layers 304B and 304C. In some embodiments, the etching step selectively etches the first semiconductor layers 302 at a faster etch rate than it etches the second semiconductor layers 304. Therefore, the second semiconductor layers 304 may remain substantially intact after the selective etching step is complete.

In embodiments in which the first semiconductor layers 302 include, e.g., SiGe, and the second semiconductor layers 304 include, e.g., Si or SiC, fluorine-based etchant that can form fluorine radicals (e.g., NF*, NF$_2$*, and F*) may be used to selectively etch the SiGe layers 302. For example, this SiGe selective etching step may be an isotropic dry etching process using a fluorine-containing gas (e.g., NF$_3$ or CF$_4$) as a main precursor gas and performed at a flow rate of the fluorine-containing gas in a range from about 1 standard cubic centimeters per minute (sccm) to about 200 sccm (e.g., 7 ccmm), at a chamber temperature in a range from about 0 degrees Centigrade to about 200 degrees Centigrade (e.g., 14 degrees Centigrade), and at a pressure in a range from about 1 torr to about 100 torr (e.g., 7 torr). The SiGe selective etching step performed using the foregoing conditions can result in a SiGe etch rate in a range from about 10 nm/min to about 20 nm/min (e.g., 15 nm/min), and an etch rate ratio of SiGe to Si in a range from about 40:1 to about 100:1. Etching process conditions out of the above selected ranges may result in unduly high SiGe etch rate, unduly low etching selectivity of SiGe over Si, and/or non-negligible surface roughness on sidewalls of the first semiconductor layers 302.

In some embodiments, the etching step also etches the first semiconductor layer 302A at a faster etch rate than it etches the first semiconductor layers 302B and 302C, which in turn allows for leaving end portions 318B and 318C of the first semiconductor layers 302B and 302C below the gate spacers 314, while not leaving an end portion of the first semiconductor layer 302A below the gate spacers 314. These end portions 318B and 318C can act as parts of interbridge channels connecting subsequently formed source/drain epitaxial structures. In some embodiments, the interbridge mask 316 serves to protect the end portions 318B and 318C of the first semiconductor layers 302B and 302C from being etched in a direction perpendicular to the outer sidewalls of the gate spacers 314.

In some embodiments where the first semiconductor layer 302A has a higher germanium atomic concentration than the first semiconductor layers 302B and 302C, the fluorine-based etchant can etch the first semiconductor layer 302A at a faster etch rate, because in the etching step using the fluorine-based etchant, the SiGe etch rate increases as the germanium atomic percentage increases. In some embodiments where the first semiconductor layers 302B and 302C have substantially the same germanium concentration, the end portions 318B and 318C below the gate spacers 314 have substantially the same width as illustrated in FIG. 15C. In some embodiments where the first semiconductor layer 302C has a higher germanium atomic concentration than the first semiconductor layer 302B, the end portion 318C of the first semiconductor layer 302C has a smaller width than the end portion 318B of the first semiconductor layer 302B because of the etch rate difference resulting from the fluorine-based etchant, which in turn allows for a width difference in the interbridge layers as illustrated in FIG. 8A.

FIG. 16A is a top view of an intermediate stage in manufacturing of a nano-FET, FIG. 16B is a cross-sectional view corresponding to the line B-B' illustrated in FIG. 16A, FIG. 16C is a cross-sectional view corresponding to the line C-C' illustrated in FIG. 16A, and FIG. 16D is a cross-sectional view corresponding to the line D-D' illustrated in FIG. 16A. In FIGS. 16A-16D, the interbridge mask 316 is removed, for example, by using a selective etching process that etches the dielectric material of the interbridge mask 316 at a faster etch rate than it etches other materials on the substrate 300. Once the interbridge mask 316 has been removed, end portions 318B and 318C of the first semiconductor layers 302B and 302C get exposed at outer sidewalls of the gate spacers 314.

FIG. 17A is a top view of an intermediate stage in manufacturing of a nano-FET, FIG. 17B is a cross-sectional view corresponding to the line B-B' illustrated in FIG. 17A, FIG. 17C is a cross-sectional view corresponding to the line C-C' illustrated in FIG. 17A, and FIG. 17D is a cross-sectional view corresponding to the line D-D' illustrated in FIG. 17A. In FIGS. 17A-17D, inner spacers 320A, 320B, and 320C (collectively referred to as inner spacers 320) are formed in the sidewall recesses 319A, 319B, and 319C, respectively. The inner spacers 320 may be formed by depositing an inner spacer layer (not separately illustrated) over the structures illustrated in FIGS. 16A-16D. The inner spacers 320 act as isolation features between subsequently formed source/drain epitaxial structures and gate structure. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 320.

Figure 18A:
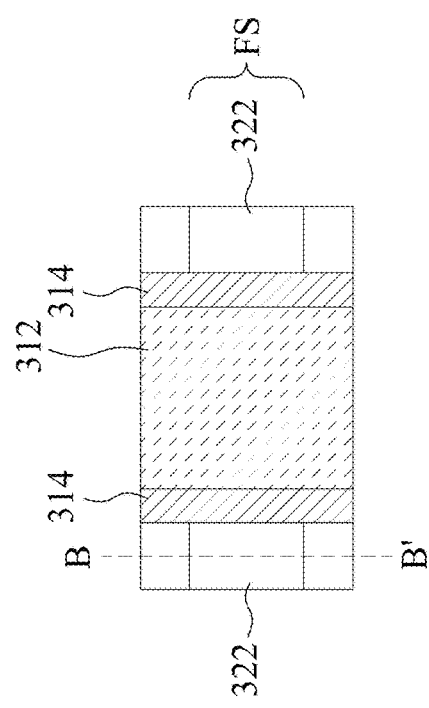
Figure 18B:
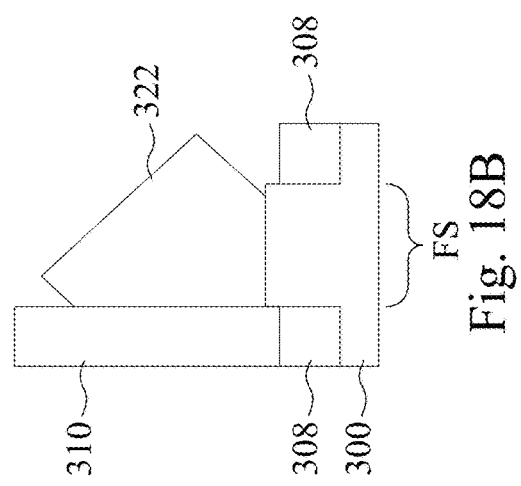

FIG. 18A is a top view of an intermediate stage in manufacturing of a nano-FET, FIG. 18B is a cross-sectional view corresponding to the line B-B' illustrated in FIG. 18A. In FIGS. 18A-18B, epitaxial source/drain structures 322 are formed on the recessed portions of the fin structure. In some embodiments, the source/drain regions 322 may exert stress on the nanostructure layers 304 and end portions 318B and 318C of the interbridge layers, thereby improving device performance. As illustrated in FIG. 18A, the epitaxial source/drain structures 322 are formed such that each dummy gate structure 312 is disposed between respective neighboring pairs of the epitaxial source/drain structures 322. In some embodiments, the gate spacers 314 are used to separate the epitaxial source/drain structures 322 from the dummy gate structure 312, and the inner spacers 320 are used to separate the epitaxial source/drain structures 322 from portions of the interbridge layers 302B and 302C by an appropriate lateral distance, so that the epitaxial source/drain structures 322 do not short out with a subsequently formed gate of the resulting nano-FET that will take the place of the portions of the interbridge layers 302B and 302C.

In some embodiments, the epitaxial source/drain structures 322 may include any acceptable material appropriate for n-type nano-FETs. For example, if the nanostructure layers 304 are silicon, the epitaxial source/drain structures 322 may include materials exerting a tensile strain on the nanostructure layers 304, such as silicon carbide, phosphorous doped silicon carbide, silicon phosphide, or the like. In some embodiments, the epitaxial source/drain structures 322 may include any acceptable material appropriate for p-type nano-FETs. For example, if the nanostructure layers 304 are silicon, the epitaxial source/drain structures 322 may comprise materials exerting a compressive strain on the nanostructure layers 304, such as silicon germanium, boron doped silicon germanium, germanium, germanium tin, or the like. The epitaxial source/drain structures 322 may have facets as illustrated in FIG. 18B.

The epitaxial source/drain structures 322 may be implanted with dopants to form source/drain regions, followed by an anneal. The source/drain regions may have an impurity concentration of between about $1\times10^{17}$ atoms/cm$^3$ and about $1\times10^{22}$ atoms/cm$^3$ in some embodiments of the present disclosure. The p-type impurity includes, for example, boron, boron fluoride, indium, or the like. The n-type impurity includes, for example, phosphorus, arsenic, antimony, or the like. In some embodiments, the epitaxial source/drain structures 322 may be in situ doped during growth.

Figure 19A:
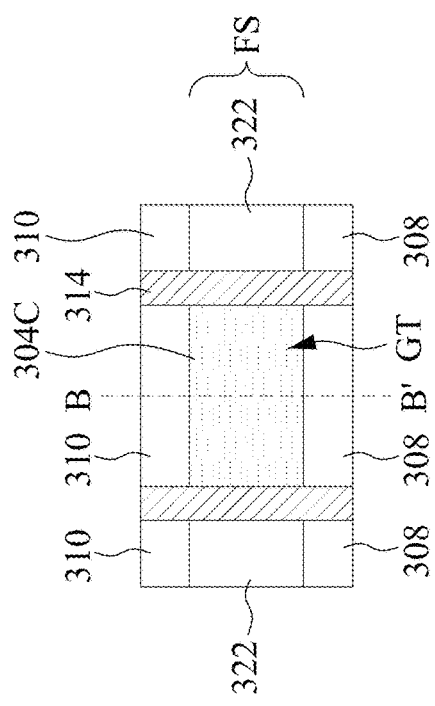
Figure 19B:
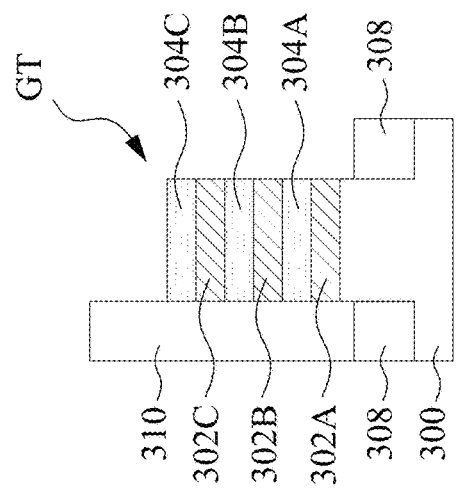

FIG. 19A is a top view of an intermediate stage in manufacturing of a nano-FET, FIG. 19B is a cross-sectional view corresponding to the line B-B' illustrated in FIG. 19A. In FIGS. 19A-19B, the dummy gate structure 312 is removed in one or more etching steps, so that a gate trench GT is formed between corresponding gate spacers 314. In some embodiments, an interlayer dielectric (ILD) layer is formed over the epitaxial source/drain structures 322 before removing the dummy gate structure 312. In some embodiments, the dummy gate structure 312 is removed by an anisotropic dry etch process. For example, the etching process may include a dry etch process using reaction gas(es) that selectively etch the dummy gate structure 312 at a faster rate than the gate spacers 314 and the ILD layer. The gate trench GT exposes and/or overlies the nanostructure layers 304 and the interbridge layers 302.

Figure 20A:
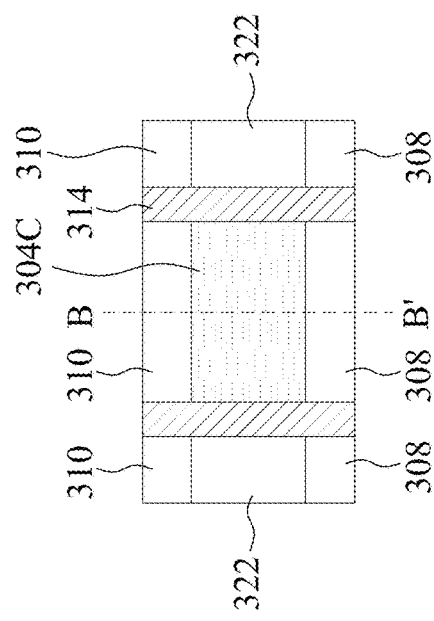
Figure 20B:
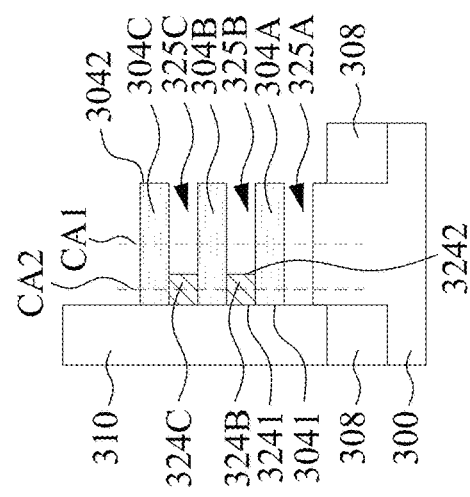

FIG. 20A is a top view of an intermediate stage in manufacturing of a nano-FET, FIG. 20B is a cross-sectional view corresponding to the line B-B' illustrated in FIG. 20A. In FIGS. 20A-20B, a selective etching process is performed to selectively etch the interbridge layers 302 exposed in the gate trench GT between the gate spacers 314. This etching step forms an opening 325A below the nanostructure layer 304A, an opening 325B between the nanostructure layers 304A and 304B, and an opening 325C between the nanostructure layers 304B and 304C. In some embodiments, the etching step selectively etches the interbridge layers 302 at a faster etch rate than it etches the nanostructure layers 304. Therefore, the nanostructure layers 304 may remain substantially intact after the selective etching step is complete.

In embodiments in which the interbridge layers 302 include, e.g., SiGe, and the nanostructure layers 304 include, e.g., Si or SiC, fluorine-based etchant that can form fluorine radicals (e.g., NF*, NF$_{2*}$, and F*) may be used to selectively etch the SiGe layers 302. For example, this SiGe selective etching step may be an isotropic dry etching process using a fluorine-containing gas (e.g., NF$_3$ or CF$_4$) as a main precursor gas and performed at a flow rate of the fluorine-containing gas in a range from about 1 standard cubic centimeters per minute (sccm) to about 200 sccm (e.g., 7 ccmm), at a chamber temperature in a range from about 0 degrees Centigrade to about 200 degrees Centigrade (e.g., 14 degrees Centigrade), and at a pressure in a range from about 1 torr to about 100 torr (e.g., 7 torr). The SiGe selective etching step performed using the foregoing conditions can result in a SiGe etch rate in a range from about 10 nm/min to about 20 nm/min (e.g., 15 nm/min), and an etch rate ratio of SiGe to Si in a range from about 40:1 to about 100:1. Etching process conditions out of the above selected ranges may result in unduly high SiGe etch rate, unduly low etching selectivity of SiGe over Si, and/or non-negligible surface roughness on sidewalls of the interbridge layers 302.

In some embodiments, the etching step also etches the interbridge layer 302A at a faster etch rate than it etches the interbridge layers 302B and 302C, which in turn allows for leaving portions 324B and 324C of the interbridge layers 302B and 302C between the gate spacers 314, while not leaving a portion of the interbridge layer 302A between the gate spacers 314. These remaining portions 324B and 324C bridge the nanostructure layers 304A-304C and thus collectively form an E-shaped semiconductor channel structure that allows a current flow between the epitaxial source/drain structures 322. The remaining portions 324B and 324C can thus be referred to as interbridge channels 324B and 324C (collectively referred to as 324), and the nanostructure layers 304A-304C can be referred to as nanostructure channels 304A-304C (collectively referred to as 304).

In FIG. 20B, the E-shaped semiconductor channel structure includes alternately stacking nanostructure channels (i.e., first semiconductor layers) 304 and interbridge channels (i.e., second semiconductor layers) 324. Central axes CA2 of the interbridge channels 324 are laterally offset from central axes CA1 of the nano structure channels 304. In some embodiments, the interbridge channels 324 non-overlap with the central axes CA1 of the nanostructure channels 304. The interbridge channels 324 have a smaller width than the nanostructure channels 304. In some embodiments, the width of the interbridge channels 324 is less than half a width of the nanostructure channels 304. In some embodiments, the nanostructure channels 304 have opposite first and second side surfaces 3041 and 3042, the interbridge channels 324 have opposite third and fourth side surfaces 3241 and 3242. The first side surfaces 3041 of the nanostructure channels 304 are aligned with the third side surfaces 3241 of the interbridge channels 324. The fourth side surfaces 3242 of the interbridge channels 324 are laterally set back from the second side surfaces 3042 of the nanostructure channels 304. The interbridge channels 324 are made of a different material than the nanostructure channels 304. For example, the interbridge channels 324 are germanium-containing semiconductor layers (e.g., SiGe layers), and the nanostructure channels 304 are germanium-free semiconductor layers (e.g., Si layers). Therefore, the interbridge channels 324 have a greater germanium atomic percentage than the nanostructure channels 304.

In some embodiments where the interbridge layer 302A has a higher germanium atomic concentration than the interbridge layers 302B and 302C, the fluorine-based etchant can etch the interbridge layer 302A at a faster etch rate, because in the etching step using the fluorine-based etchant, the SiGe etch rate increases as the germanium atomic percentage increases. In some embodiments where the interbridge layers 302B and 302C have substantially the same germanium concentration, the resultant interbridge channels 324B and 324C between the gate spacers 314 have substantially the same width as illustrated in FIG. 20B. In some embodiments where the interbridge layer 302C has a higher germanium atomic concentration than the interbridge layer 302B, the resultant interbridge channel 324C has a smaller width than the resultant interbridge channel 324B because of the etch rate difference resulting from the fluorine-based etchant, which in turn allows for a width difference in the interbridge channels as illustrated in FIG. 8A. In that case, the interbridge channels 324B and 324C have misaligned side surfaces 3242. In some embodiments where the nanostructure channels 304 have substantially the same width, a width difference between the interbridge channels 324 is greater than a width difference between the nanostructure channels 304.

In some embodiments, both the channel formation step as illustrated in FIGS. 20A-20B and the previous sidewall recessing step as illustrated in FIGS. 15A-15D use a selective etching process that etches the interbridge layers 302 (e.g., SiGe) at a faster etch rate than etching the nanostructure layers 304 (e.g., Si), and therefore these two steps may use the same etchant chemistry (e.g., fluorine-based etchant) in some embodiments. In this case, the etching time/duration of the channel formation step as illustrated in FIGS. 20A-20B may be longer than the etching time/duration of the previous sidewall recessing step as illustrated in FIGS. 15A-15D.

Figure 21A:
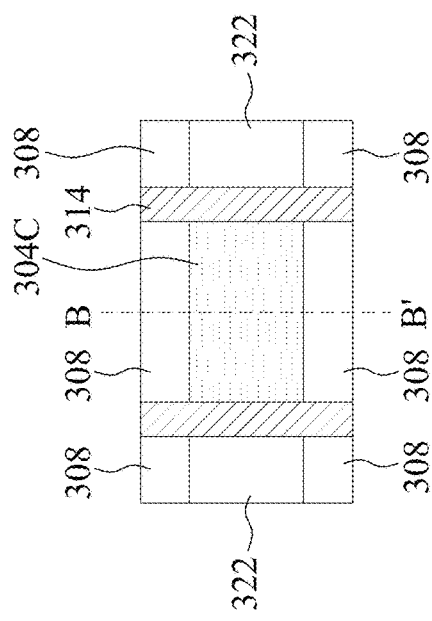
Figure 21B:
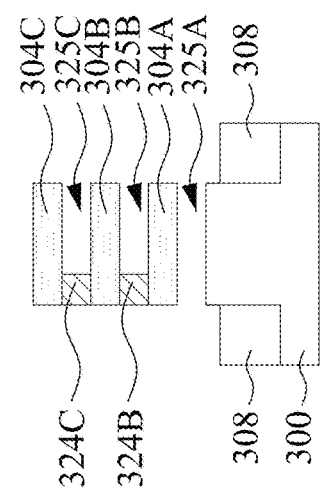

FIG. 21A is a top view of an intermediate stage in manufacturing of a nano-FET, FIG. 21B is a cross-sectional view corresponding to the line B-B' illustrated in FIG. 21A. In FIGS. 21A-21B, the dielectric wall 310 is removed, for example, by using a selective etching process that etches the dielectric material of the dielectric wall 310 at a faster etch rate than it etches the semiconductor materials of the nanostructure channels 304 and interbridge channels 324.

In some embodiments where the dielectric wall 310 is made of silicon oxide ($SiO_2$), the silicon oxide wall 310 can be removed using a cyclic process including one or more repetitions of a plasma treatment step and an annealing step. For example, it may perform a plasma treatment step followed by an annealing step, and then repeats the plasma treatment step and the annealing step. The plasma treatment step serves to selectively etch silicon oxide, and the annealing step serves to remove solid byproducts resulting from the plasma treatment step. In the plasma treatment step the substrate 300 having the structure as illustrated in FIGS. 20A-20B is loaded into a plasma tool and exposed to a plasma environment generated by RF or microwave power in a gaseous mixture of a $NF_3$ gas and a $NH_3$ gas, at a flow rate ratio of $NF_3$ gas to $NH_3$ gas in a range from about 2 to about 100, at a temperature in a range from about 0 degrees Centigrade to about 50 degrees Centigrade (e.g., 35 degrees Centigrade), and at a pressure in a range from about 1 torr to about 100 torr. The annealing temperature of the annealing step is in a range from about 100 degrees Centigrade to about 200 degrees Centigrade (e.g., greater than 100 degrees Centigrade). The $SiO_2$ selective etching process using the foregoing conditions has a high selectivity against semiconductor materials (e.g., Si and SiGe), which in turn results in no or negligible loss in the nanostructure channels 304 and the interbridge channels 324. In some embodiments where the STI regions 308 are made of silicon oxide, the etching time/duration of the $SiO_2$ selective etching process is controlled to prevent over-etching the STI regions 308, which in turn results in a no or negligible loss in the STI regions 308. In some embodiments, before the $SiO_2$ selective etching process, a patterned mask may be formed over portions of the STI regions 308 not covered by the dielectric wall 310, so as to protect these portions of STI regions 308 from being damaged by the $SiO_2$ selective etching process.

Figure 22A:
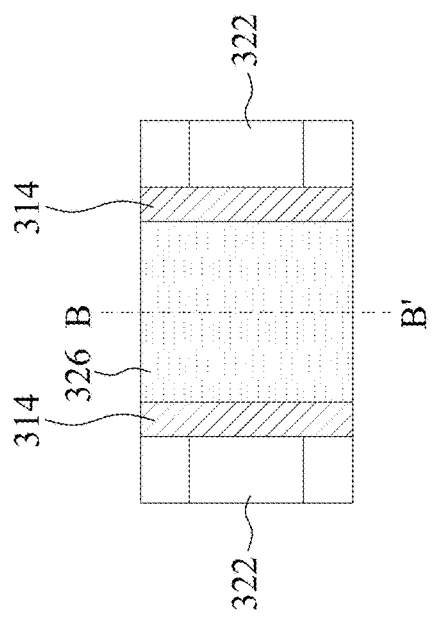
Figure 22B:
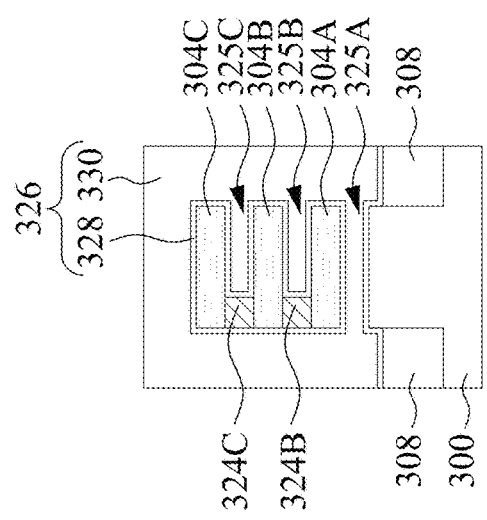

FIG. 22A is a top view of an intermediate stage in manufacturing of a nano-FET, FIG. 22B is a cross-sectional view corresponding to the line B-B' illustrated in FIG. 22A. In FIGS. 22A-22B, replacement gate structure 326 is formed in the gate trench GT between the gate spacers 314 to surround the nanostructure channels 304 and interbridge channels 324 suspended between the gate spacers 314. The gate structure 326 may be the final gate of a nano-FET. The final gate structure may be a high-k/metal gate stack, however other compositions are possible. In some embodiments, each of the gate structures 326 forms the gate associated with the multi-channels provided by the nanostructure channels 304 and interbridge channels 324. For example, the high-k/metal gate structure 326 is formed within the openings 325 (as illustrated in FIG. 21B) provided by etching the interbridge layers. In various embodiments, the high-k/metal gate structure 326 includes a gate dielectric layer 328 formed around the nanostructure channels 304 and interbridge channels 324, and a gate metal 330 formed around the gate dielectric layer 328. The gate metal 330 may include one or more work function metal layers formed around the gate dielectric layer 328, and a fill metal formed around the one or more work function metal layers and filling a remainder of gate trench GT.

In some embodiments, the gate dielectric layer 328 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer and/or fill metal layer used within the gate metal 330 may include a metal, metal alloy, or metal silicide. Formation of the high-k/metal gate (HKMG) structure 326 may include depositions to form various gate materials, and one or more CMP processes to remove excessive gate materials.

In some embodiments, the interfacial layer of the gate dielectric layer 328 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 328 may include hafnium oxide ($HfO_2$). Alternatively, the gate dielectric layer 328 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer in the gate metal 330 may include work function metals to provide a suitable work function for the high-k/metal gate structures 326. For an n-type nano-FET, the work function metal layer may include one or more n-type work function metals (N-metal), which has a work function lower than a mid-gap wok function (about 4.5 eV) that is in the middle of the valance band and the conduction band of silicon. The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type nano-FET, the work function metal layer may include one or more p-type work function metals (P-metal) having a work function higher than the mid-gap work function of silicon. The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal 330 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

FIGS. 23A-31B are top views and cross-sectional views of intermediate stages in the manufacturing of nano-FETs, in accordance with some embodiments of the present disclosure. In general, the nano-FETs fabricated using the steps as illustrated in FIGS. 23A-31B have separate and symmetric E-shaped channel structures but a shared gate structure surrounding both the E-shaped channel structures. It is understood that additional operations can be provided before, during, and after processes shown by FIGS. 23A-31B, and some of the operations described below can be replaced or eliminated, for additional embodiments of the method. The order of the operations/processes may be interchangeable.

Figure 23A:
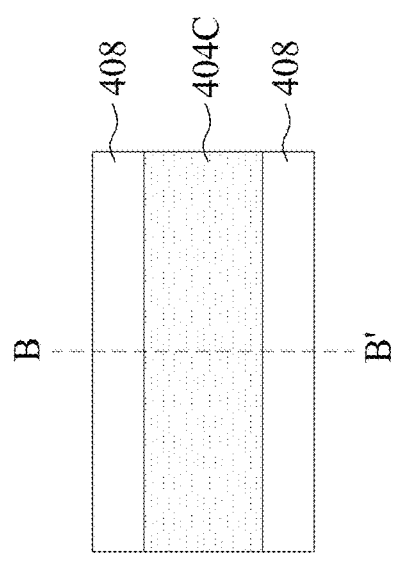
FIGS. 23A-31B are top views and cross-sectional views of intermediate stages in the manufacturing of nano-FETs, in accordance with some embodiments of the present disclosure.
Figure 23B:
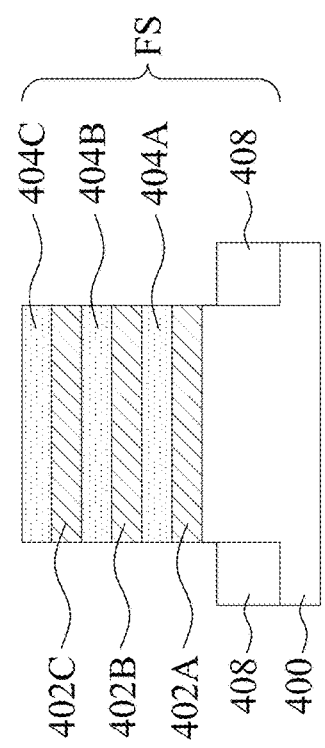

FIG. 23A is a top view of an intermediate stage in manufacturing of nano-FETs, and FIG. 23B is a cross-sectional view corresponding to the line B-B' illustrated in FIG. 23A. In FIGS. 23A and 23B, a fin structure FS of alternating stacked first semiconductor layers (interbridge layers) 402A-402C and second semiconductor layers (nanostructure layers) 404A-404C are formed over a substrate 400, and STI regions 408 are formed around a lower portion of the fin structure FS. Material and process details about the substrate 400, interbridge layers 402A-402C (collectively referred to 402), nanostructure layers 404A-404C (collectively referred to as 404), and the SIT regions 408 are similar to that of the substrate 300, interbridge layers 302, nanostructure layers 304, and the SIT regions 308 as discussed previously, and thus they are not repeated for the sake of brevity.

Figure 24A:
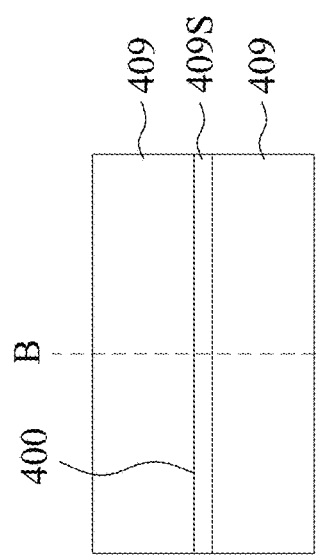
Figure 24B:
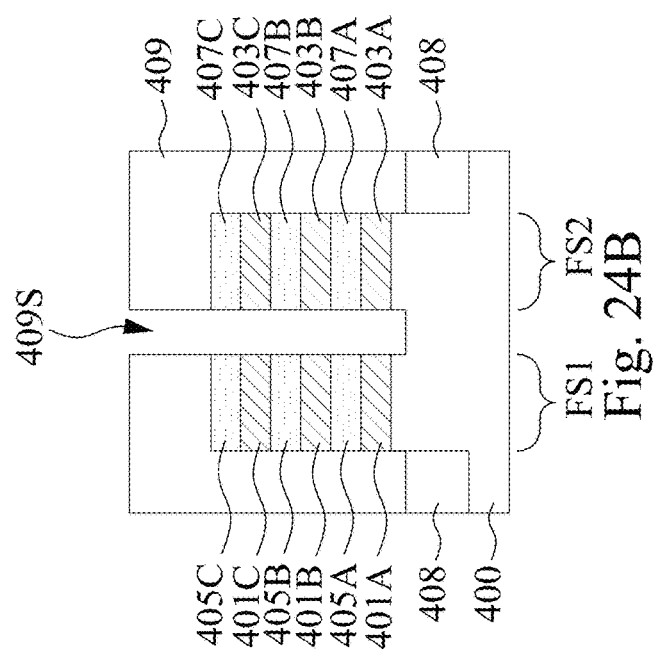

FIG. 24A is a top view of an intermediate stage in manufacturing of nano-FETs, and FIG. 24B is a cross-sectional view corresponding to the line B-B' illustrated in FIG. 24A. In FIGS. 24A and 24B, a patterned mask layer 409 is formed over the substrate 400, and then the fin structure is anisotropically etched by using the patterned mask layer 409 as an etch mask to form a trench 409S that breaks the fin structure into two separate fin structures FS1 and FS2, wherein the fin structure FS1 includes alternating interbridge layers 401A-401C and nanostructure layers 405A-405C, and the fin structure FS2 includes alternating interbridge layers 403A-403C and nanostructure layers 407A-407C.

The separate interbridge layers 401A and 403A have the same material because they are both formed from the interbridge layer 402A as illustrated in FIG. 23B. The separate interbridge layers 401B and 403B have the same material because they are both formed from the interbridge layer 402B. The separate interbridge layers 401C and 403C have the same material because they are both formed from the interbridge layer 402C. In some embodiments, the interbridge layers 401A and 403A may have a higher germanium atomic concentration than the upper interbridge layers 401B-401C and 403B-403C, which in turn allows for removing the bottom interbridge layers 401A and 403A while leaving portions of upper interbridge layers 401B-401C and 403B-403C to serve as interbridge channels in a following SiGe selective etching process.

The separate nanostructure layers 405A and 407A have the same material because they are both formed from the nanostructure layer 404A. The separate nanostructure layers 405B and 407B have the same material because they are both formed from the nanostructure layer 404B. The separate nanostructure layers 405C and 407C have the same material because they are both formed from the nanostructure layer 404C. In some embodiments, the nanostructure layers 405A-405C and 407A-407C is silicon and substantially free of germanium.

Figure 25A:
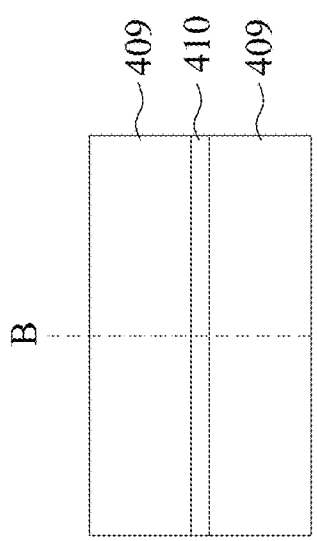
Figure 25B:
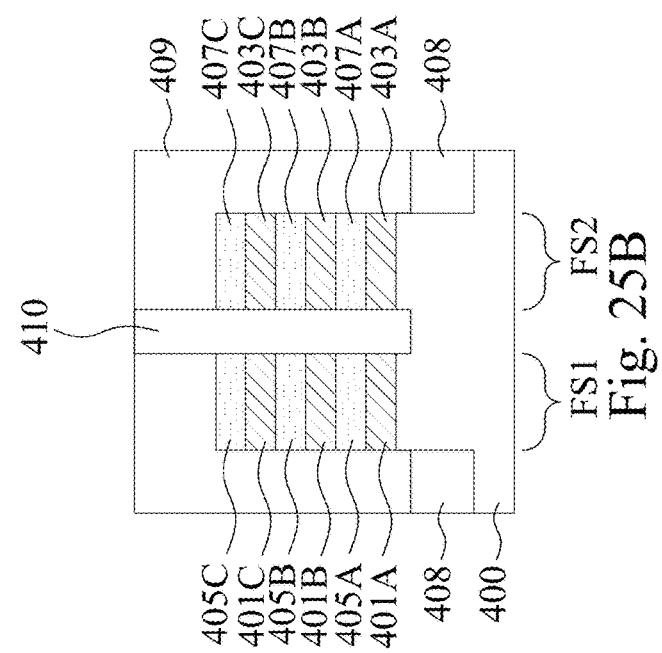

FIG. 25A is a top view of an intermediate stage in manufacturing of nano-FETs, and FIG. 25B is a cross-sectional view corresponding to the line B-B' illustrated in FIG. 25A. In FIGS. 25A and 25B, a dielectric wall 410 is formed in the trench 409S to electrically isolate the fin structures FS1 and FS2. The dielectric wall 410 may be formed by depositing a dielectric material in the trench 409S until the trench 409S is overfilled, followed by performing a CMP process to remove excessive dielectric material outside the trench 409S. In some embodiments, the dielectric wall 410 includes silicon oxide, silicon nitride, silicon oxynitride, and/or other suitable dielectric materials, and is deposited using, for example, CVD, ALD, PVD, or other suitable deposition techniques.

Figure 26A:
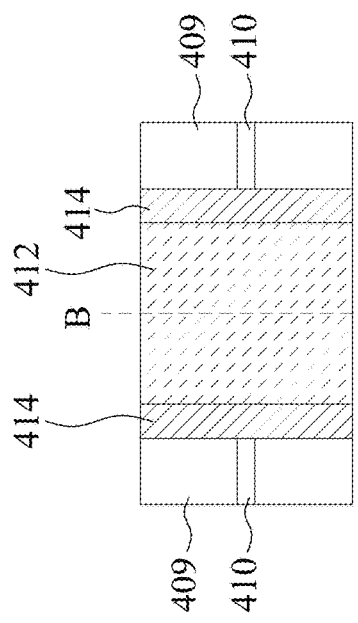
Figure 26B:
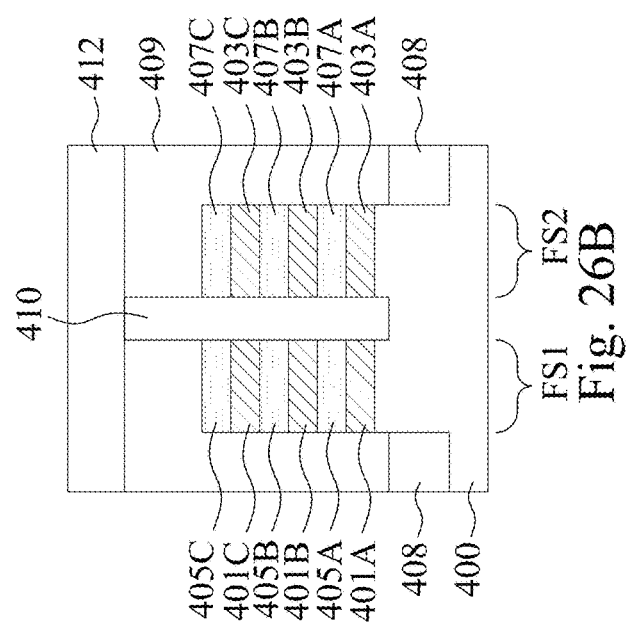

FIG. 26A is a top view of an intermediate stage in manufacturing of nano-FETs, and FIG. 26B is a cross-sectional view corresponding to the line B-B' illustrated in FIG. 26A. In FIGS. 26A and 26B, a dummy gate structure 412 is formed across both the fin structures FS1 and FS2. The dummy gate structure 412 has a lengthwise direction perpendicular to the lengthwise direction of the fin structures FS1 and FS2. Next, gate spacers 414 are formed on sidewalls of the dummy gate structure 412. Material and process details about the dummy gate structure 412 and gate spacers 414 are similar to that of the dummy gate structure 312 and gate spacers 314 as discussed previously, and thus they are not repeated for the sake of brevity.

Figure 27A:
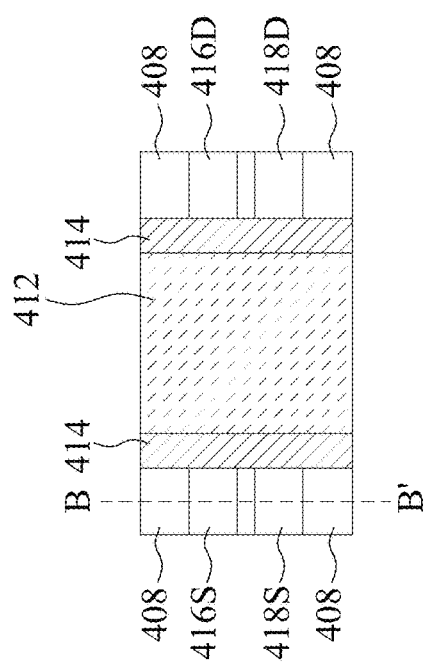
Figure 27B:
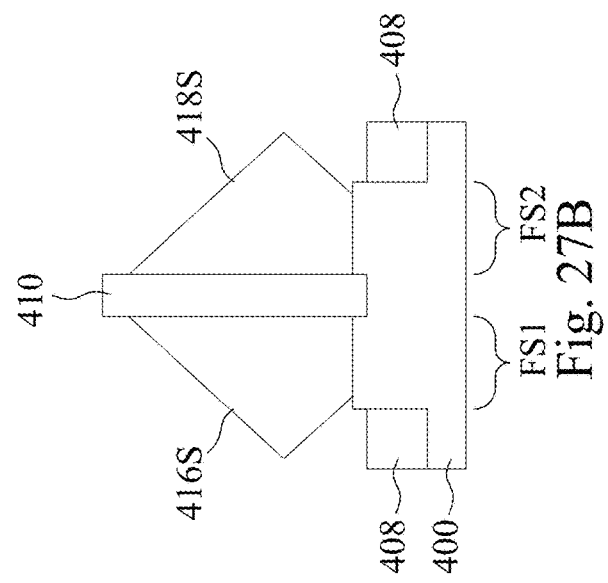

FIG. 27A is a top view of an intermediate stage in manufacturing of nano-FETs, and FIG. 27B is a cross-sectional view corresponding to the line B-B' illustrated in FIG. 27A. In FIGS. 27A and 27B, portions of the fin structures FS1 and FS2 extending beyond the gate structure 412 and gate spacers 414 are recessed, and then epitaxial source/drain structures 416S, 416D are formed on the recessed portions of the fin structure FS1, and epitaxial source/drain structures 418S, 418D are formed on the recessed portions of the fin structure FS2. Epitaxial growth time/duration is controlled such that topmost positions of the epitaxial source/drain structures 416S, 416D, 418S, 418D are lower than a topmost position of the dielectric wall 410, and thus the epitaxial source structure 416S is entirely spaced apart from the epitaxial source structure 418S by the dielectric wall 410, and the epitaxial drain structure 416D is entirely spaced apart from the epitaxial drain structure 418D by the dielectric wall 410. Material and process details about the epitaxial source/drain structures 416S, 416D, 418S, 418D are similar to that of the epitaxial source/drain structures 322 as discussed previously, and thus they are not repeated for the sake of brevity.

Figure 28A:
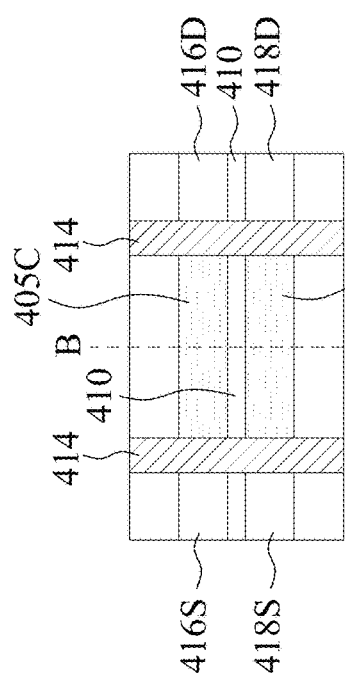
Figure 28B:
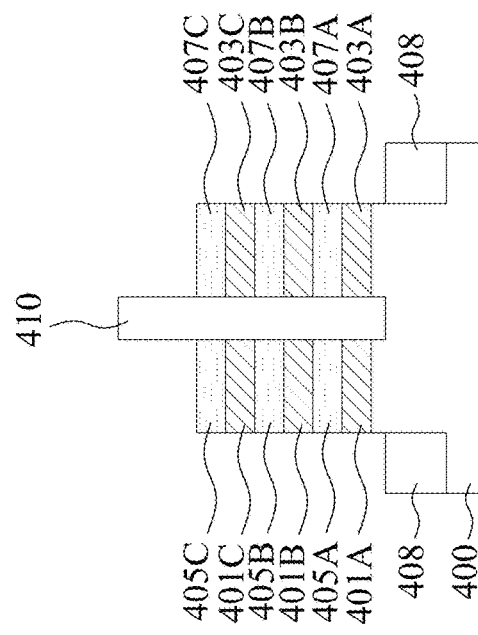

FIG. 28A is a top view of an intermediate stage in manufacturing of nano-FETs, and FIG. 28B is a cross-sectional view corresponding to the line B-B' illustrated in FIG. 28A. In FIGS. 28A and 28B, the dummy gate structure 412 is removed in one or more etching steps, so that a gate trench is formed between corresponding gate spacers 414. In some embodiments, an ILD layer is formed over the epitaxial source/drain structures 416S, 416D, 418S, 418D before removing the dummy gate structure 412. In some embodiments, the dummy gate structure 412 is removed by an anisotropic dry etch process. For example, the etching process may include a dry etch process using reaction gas(es) that selectively etch the dummy gate structure 412 at a faster rate than the gate spacers 414 and the ILD layer. The gate trench exposes the nanostructure layers 405 and interbridge layers 401 on the left side of the dielectric wall 410, and the nanostructure layers 407 and interbridge layers 403 on the right side of the dielectric wall 410. The gate trench also exposes a portion of the dielectric wall 410 between the gate spacers 414.

Figure 29A:
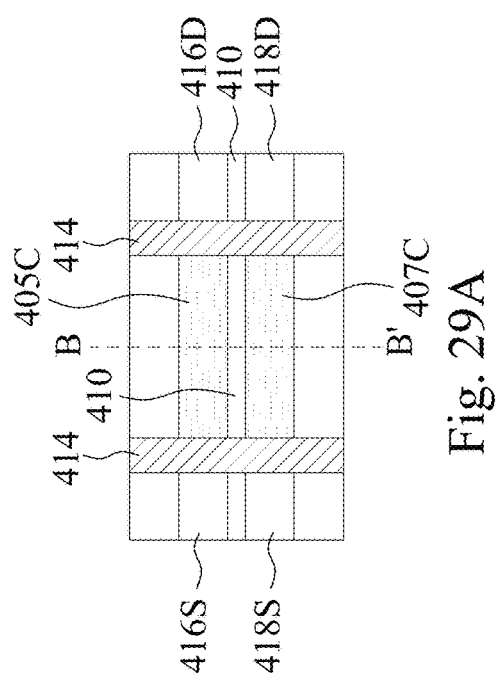
Figure 29B:
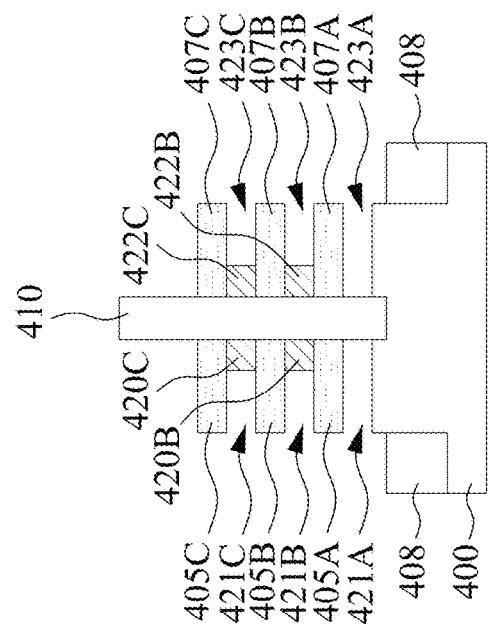

FIG. 29A is a top view of an intermediate stage in manufacturing of nano-FETs, and FIG. 29B is a cross-sectional view corresponding to the line B-B' illustrated in FIG. 29A. In FIGS. 29A and 29B, a selective etching process is performed to selectively etch the interbridge layers 401 and 403 exposed in the gate trench between the gate spacers 414. On the left side of the dielectric wall 410, this selective etching step forms an opening 421A below the nanostructure layer 405A, an opening 421B between the nanostructure layers 405A and 405B, and an opening 421C between the nanostructure layers 405B and 405C. On the right side of the dielectric wall 410, this selective etching step forms an opening 423A below the nanostructure layer 407A, an opening 423B between the nanostructure layers 407A and 407B, and an opening 423C between the nanostructure layers 407B and 407C. In some embodiments where the interbridge layers are SiGe, this etching step uses a SiGe selective etchant. Process details about the SiGe selective etching step is similar to that discussed previously with respect to FIGS. 20A-20B, and thus they are not repeated of the sake of brevity.

In some embodiments, the etching step selectively etches the interbridge layers 401 and 403 at a faster etch rate than it etches the nanostructure layers 405 and 407. Therefore, the nanostructure layers 405 and 407 may remain substantially intact after the selective etching step is complete. In some embodiments, the etching step also etches the interbridge layers 401A and 403A at a faster etch rate than it etches the interbridge layers 401B-C and 403B-C, which in turn leaves portions 420B and 420C of the interbridge layers 401B and 401C on the left side of the dielectric wall 410, and also leaves portions 422B and 422C of the interbridge layers 403B and 403C on the right side of the dielectric wall 410, while leaving no portion of the interbridge layer 401A on the left side of the dielectric wall 410 and no portion of the interbridge layer 403A on the right side of the dielectric wall 410.

The remaining portions 420B-420C bridge the nanostructure layers 405A-405C and thus collectively form a reversed E-shaped semiconductor channel structure that allows a current flow between the epitaxial source/drain structures 416S and 416D. The remaining portions 420B-420C can thus be referred to as interbridge channels on the left side of the dielectric wall 410, and the nanostructure layers 405A-405C can be referred to as nanostructure channels on the left side of the dielectric wall 410. The remaining portions 422B-422C bridge the nanostructure layers 407A-407C and thus collectively form an E-shaped semiconductor channel structure that allows a current flow between the epitaxial source/drain structures 418S and 418D. The remaining portions 422B-422C can thus be referred to as interbridge channels on the right side of the dielectric wall 410, and the nanostructure layers 407A-407C can be referred to as nanostructure channels on the right side of the dielectric wall 410. The reversed E-shaped channel structure is symmetric with the E-shaped channel structure about the dielectric wall 410, as illustrated in the cross-sectional view of FIG. 29B.

In some embodiments where the interbridge layer 401A and 403A have a higher germanium atomic concentration than the interbridge layers 401B-401C and 403B-403C, the fluorine-based etchant can etch the interbridge layer 401A and 403A at a faster etch rate, because in the etching step using the fluorine-based etchant, the SiGe etch rate increases as the germanium atomic percentage increases. In some embodiments where the interbridge layers 401B and 401C have substantially the same germanium concentration, the resultant interbridge channels 420B and 420C have substantially the same width as illustrated in FIG. 29B. In some embodiments where the interbridge layer 401C has a higher germanium atomic concentration than the interbridge layer 401B, the resultant interbridge channel 420C has a smaller width than the resultant interbridge channel 420B because of the etch rate difference resulting from the fluorine-based etchant, which in turn allows for a width difference in the interbridge channels as illustrated in FIG. 8A. Similarly, in some embodiments where the interbridge layers 403B and 403C have substantially the same germanium concentration, the resultant interbridge channels 422B and 422C have substantially the same width as illustrated in FIG. 29B. In some embodiments where the interbridge layer 403C has a higher germanium atomic concentration than the interbridge layer 403B, the resultant interbridge channel 422C has a smaller width than the resultant interbridge channel 422B because of the etch rate difference resulting from the fluorine-based etchant, which in turn allows for a width difference in the interbridge channels as illustrated in FIG. 8A.

Figure 30A:
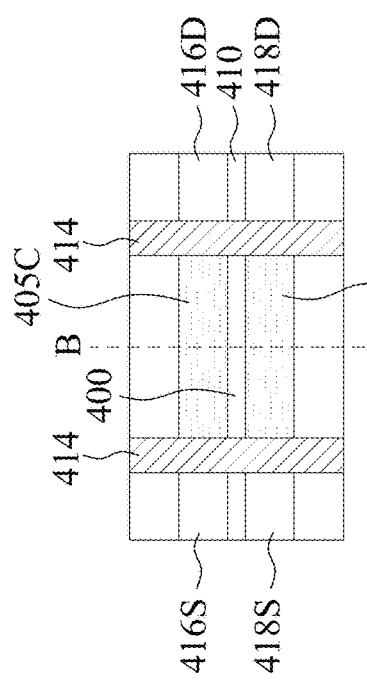
Figure 30B:
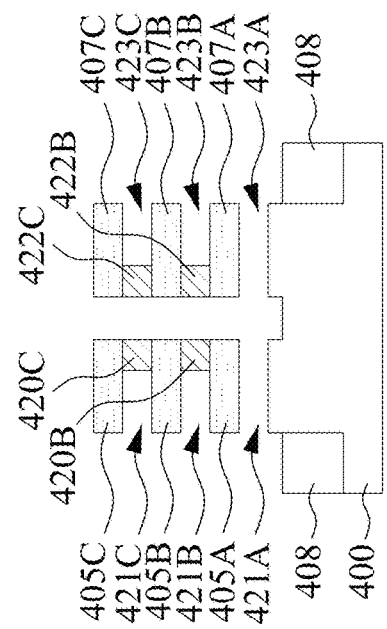

FIG. 30A is a top view of an intermediate stage in manufacturing of nano-FETs, FIG. 30B is a cross-sectional view corresponding to the line B-B' illustrated in FIG. 30A. In FIGS. 30A-30B, the dielectric wall 410 is removed, for example, by using a selective etching process that etches the dielectric material of the dielectric wall 410 at a faster etch rate than it etches the semiconductor materials of the nanostructure channels 405, 407 and interbridge channels 420, 422, and thus the nanostructure channels 405, 407 and interbridge channels 420, 422 remain substantially intact after the selective etching process is complete. In some embodiments where the dielectric wall 410 is made of silicon oxide ($SiO_2$), the silicon oxide wall 410 can be removed using a cyclic process including one or more repetitions of a plasma treatment step and an annealing step.

Process details about the SiO$_2$ selective etching process is discussed previously with respect to FIGS. 21A-21B, and thus they are not repeated for the sake of brevity.

Figure 31A:
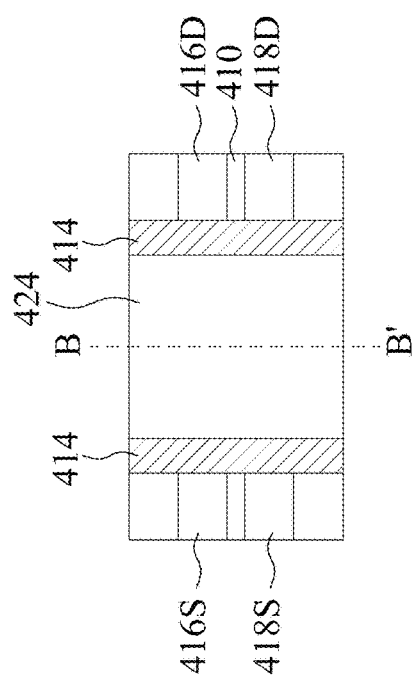
Figure 31B:
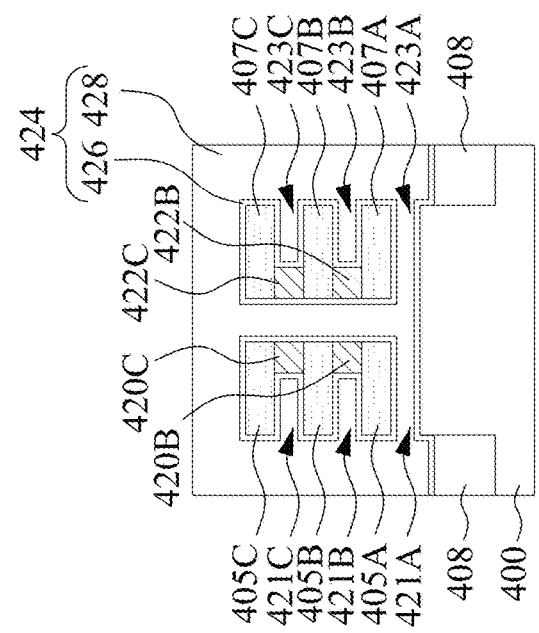

FIG. 31A is a top view of an intermediate stage in manufacturing of nano-FETs, FIG. 31B is a cross-sectional view corresponding to the line B-B' illustrated in FIG. 31A. In FIGS. 31A-31B, replacement gate structure 424 is formed in the gate trench between the gate spacers 414 to surround the nanostructure channels 405, 407 and interbridge channels 420, 422 suspended between the gate spacers 314. As a result, the reversed E-shaped channel structure of alternating nanostructure channels 405 and interbridge channels 420 shares a same gate structure 424 with the E-shaped channel structure of alternating nanostructure channels 407 and interbridge channels 422. The gate structure 424 may be a high-k/metal gate structure that includes a gate dielectric layer 426 formed around the nanostructure channels 405, 407 and interbridge channels 420, 422, and a gate metal 428 formed around the gate dielectric layer 426. The gate metal 428 may include one or more work function metal layers formed around the gate dielectric layer 426, and a fill metal formed around the one or more work function metal layers and filling a remainder of gate trench. Materials and process details about the gate structure 424 is similar to that of the gate structure 326, and thus they are not repeated for the sake of brevity.

FIGS. 32A-40B are top views and cross-sectional views of intermediate stages in the manufacturing of nano-FETs, in accordance with some embodiments of the present disclosure. In general, the nano-FETs fabricated using the steps as illustrated in FIGS. 32A-40B have separate E-shaped channel structures surrounded by separate gate structures. It is understood that additional operations can be provided before, during, and after processes shown by FIGS. 32A-40B, and some of the operations described below can be replaced or eliminated, for additional embodiments of the method. The order of the operations/processes may be interchangeable.

Figure 32A:
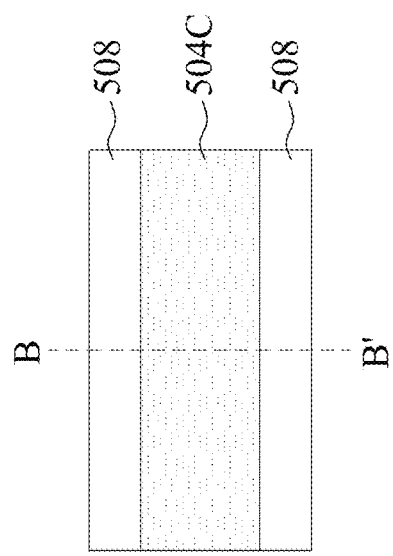
Figure 32B:
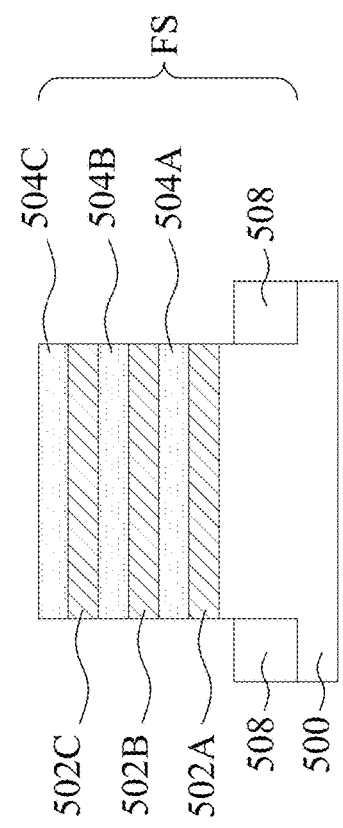

FIG. 32A is a top view of an intermediate stage in manufacturing of nano-FETs, and FIG. 32B is a cross-sectional view corresponding to the line B-B' illustrated in FIG. 32A. In FIGS. 32A and 32B, a fin structure FS of alternating stacked first semiconductor layers (interbridge layers) 502A-502C and second semiconductor layers (nanostructure layers) 504A-504C are formed over a substrate 500, and STI regions 508 are formed around a lower portion of the fin structure FS. Material and process details about the substrate 500, interbridge layers 502A-502C (collectively referred to 502), nanostructure layers 504A-504C (collectively referred to as 504), and the SIT regions 508 are similar to that of the substrate 300, interbridge layers 302, nanostructure layers 304, and the SIT regions 308 as discussed previously, and thus they are not repeated for the sake of brevity.

Figure 33A:
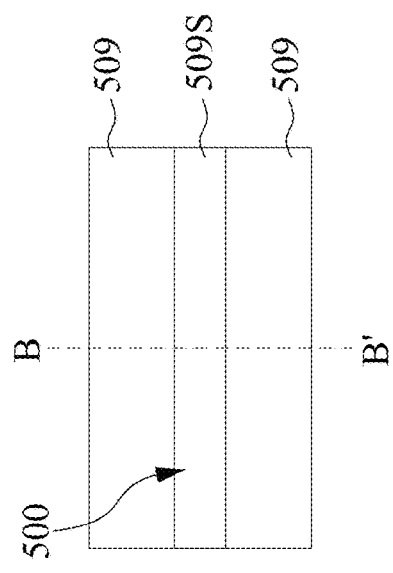
Figure 33B:
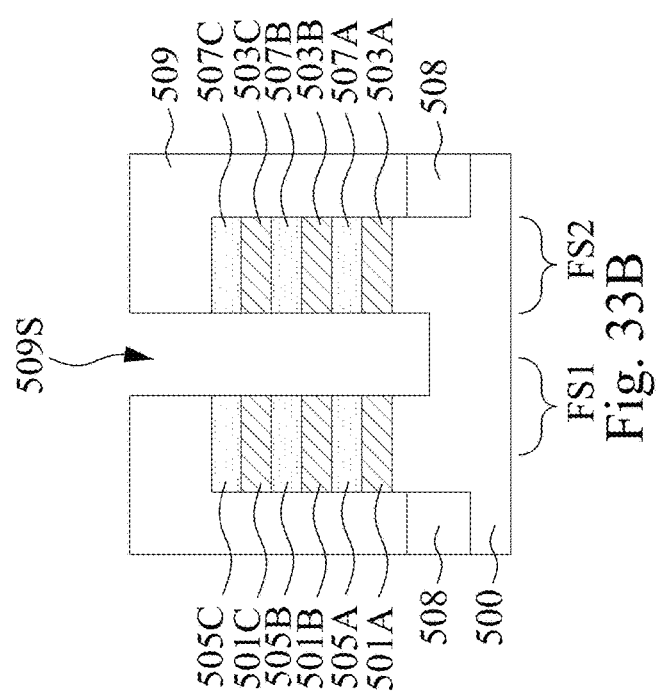

FIG. 33A is a top view of an intermediate stage in manufacturing of nano-FETs, and FIG. 33B is a cross-sectional view corresponding to the line B-B' illustrated in FIG. 33A. In FIGS. 33A and 33B, a patterned mask layer 509 is formed over the substrate 500, and then the fin structure is anisotropically etched by using the patterned mask layer 509 as an etch mask to form a trench 509S that breaks the fin structure into two separate fin structures FS1 and FS2, wherein the fin structure FS1 includes alternating interbridge layers 501A-501C and nanostructure layers 505A-505C, and the fin structure FS2 includes alternating interbridge layers 503A-503C and nanostructure layers 507A-507C.

The separate interbridge layers 501A and 503A have the same material because they are both formed from the interbridge layer 502A as illustrated in FIG. 32B. The separate interbridge layers 501B and 503B have the same material because they are both formed from the interbridge layer 502B. The separate interbridge layers 501C and 503C have the same material because they are both formed from the interbridge layer 502C. In some embodiments, the interbridge layers 501A and 503A may have a higher germanium atomic concentration than the upper interbridge layers 501B-501C and 503B-503C, which in turn allows for removing the bottom interbridge layers 501A and 503A while leaving portions of upper interbridge layers 501B-501C and 503B-503C to serve as interbridge channels in a following SiGe selective etching process.

The separate nanostructure layers 505A and 507A have the same material because they are both formed from the nanostructure layer 504A. The separate nanostructure layers 505B and 507B have the same material because they are both formed from the nanostructure layer 504B. The separate nanostructure layers 505C and 507C have the same material because they are both formed from the nanostructure layer 504C. In some embodiments, the nanostructure layers 505A-505C and 507A-507C is silicon and substantially free of germanium.

Figure 34A:
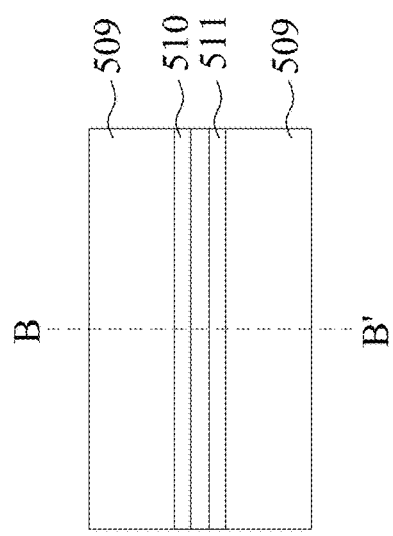
Figure 34B:
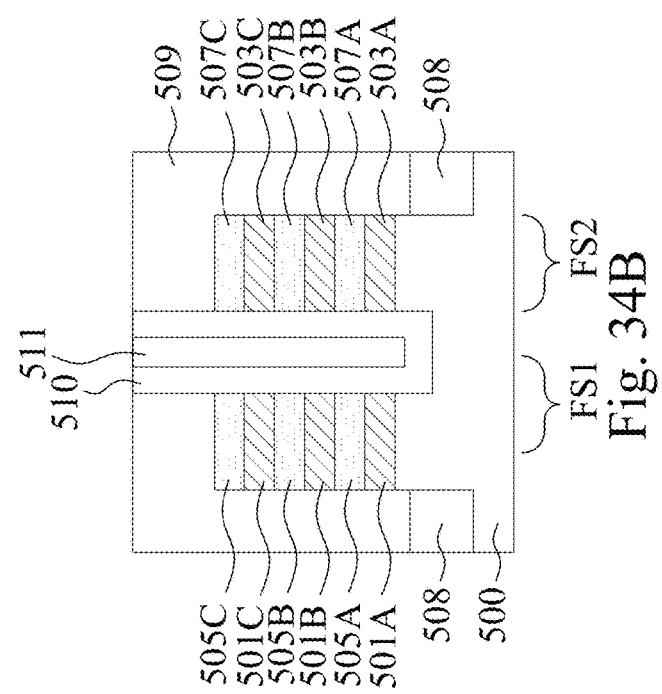

FIG. 34A is a top view of an intermediate stage in manufacturing of nano-FETs, and FIG. 34B is a cross-sectional view corresponding to the line B-B' illustrated in FIG. 34A. In FIGS. 34A and 34B, an outer dielectric wall 510 is formed in the trench 509S to electrically isolate the fin structures FS1 and FS2, and an inner dielectric wall 511 is formed over the outer dielectric wall. The outer and inner dielectric walls 510 and 511 may be formed by, for example, depositing in sequence a first dielectric layer and a second dielectric layer in the trench 509S until the trench 509S is overfilled, followed by performing a CMP process to remove excessive dielectric materials outside the trench 509S, while leaving a portion of the first dielectric layer in the trench 509S to serve as the outer dielectric wall 510 and leaving a portion of the second dielectric layer in the trench 509S to serve as the inner dielectric wall 511.

In some embodiments, the dielectric walls 510 and 511 include silicon oxide, silicon nitride, silicon oxynitride, and/or other suitable dielectric materials, and are deposited using, for example, CVD, ALD, PVD, or other suitable deposition techniques. In some embodiments, the outer dielectric wall 510 has a different material and hence a different etching selectivity than the inner dielectric wall 511. For example, the outer dielectric wall 510 includes silicon oxide, and the inner dielectric wall 511 includes silicon nitride (Si$_3$N$_4$) or other dielectric materials except for silicon oxide.

Figure 35A:
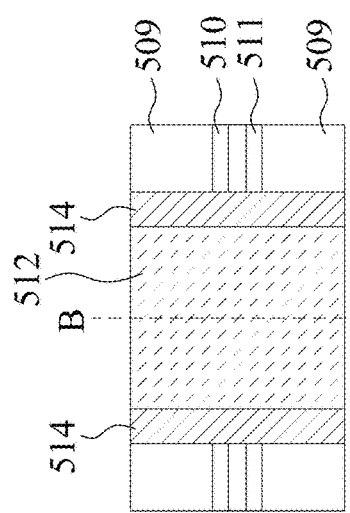
Figure 35B:
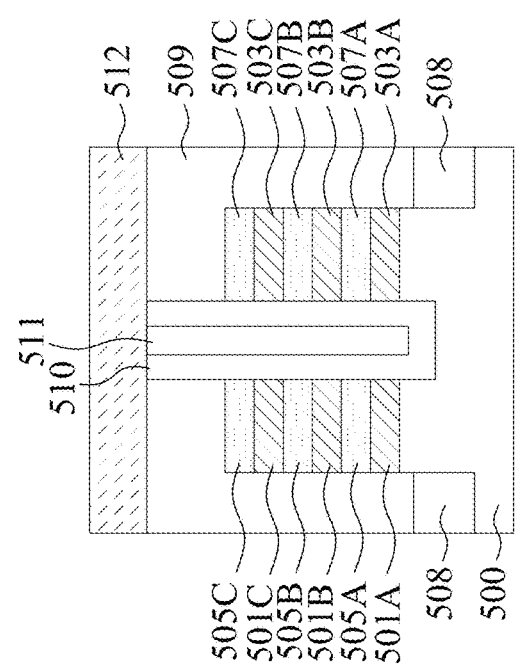

FIG. 35A is a top view of an intermediate stage in manufacturing of nano-FETs, and FIG. 35B is a cross-sectional view corresponding to the line B-B' illustrated in FIG. 35A. In FIGS. 35A and 35B, a dummy gate structure 512 is formed over both the fin structures FS1 and FS2. The dummy gate structure 512 has a lengthwise direction perpendicular to the lengthwise direction of the fin structures FS1 and FS2. Next, gate spacers 514 are formed on sidewalls of the dummy gate structure 512. Material and process details about the dummy gate structure 512 and gate spacers 514 are similar to that of the dummy gate structure 312 and gate spacers 314 as discussed previously, and thus they are not repeated for the sake of brevity.

FIG. 36A is a top view of an intermediate stage in manufacturing of nano-FETs, and FIG. 36B is a cross-sectional view corresponding to the line B-B' illustrated in FIG. 36A. In FIGS. 36A and 36B, portions of the fin structures FS1 and FS2 extending beyond the gate structure 512 and gate spacers 514 are recessed, and then epitaxial source/drain structures 516S, 516D are formed on the recessed portions of the fin structure FS1, and epitaxial source/drain structures 518S, 518D are formed on the recessed portions of the fin structure FS2. Epitaxial growth time/duration is controlled such that topmost positions of the epitaxial source/drain structures 516S, 516D, 518S, 518D are lower than a topmost position of the dielectric walls 510, 511, and thus the epitaxial source structure 516S is entirely spaced apart from the epitaxial source structure 518S by the dielectric walls 510, 511, and the epitaxial drain structure 516D is entirely spaced apart from the epitaxial drain structure 518D by the dielectric walls 510, 511. Material and process details about the epitaxial source/drain structures 516S, 516D, 518S, 518D are similar to that of the epitaxial source/drain structures 322 as discussed previously, and thus they are not repeated for the sake of brevity.

Figure 37A:
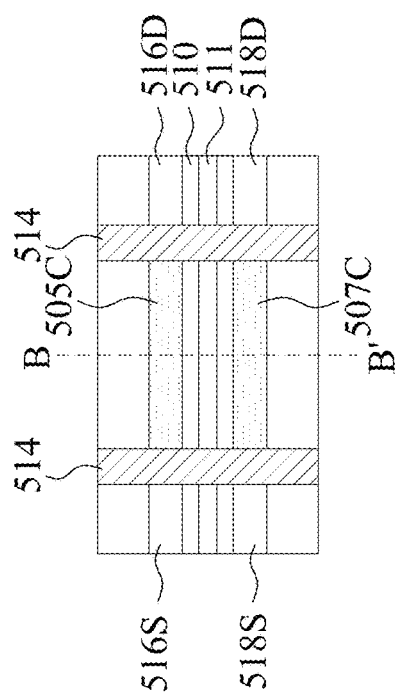
Figure 37B:
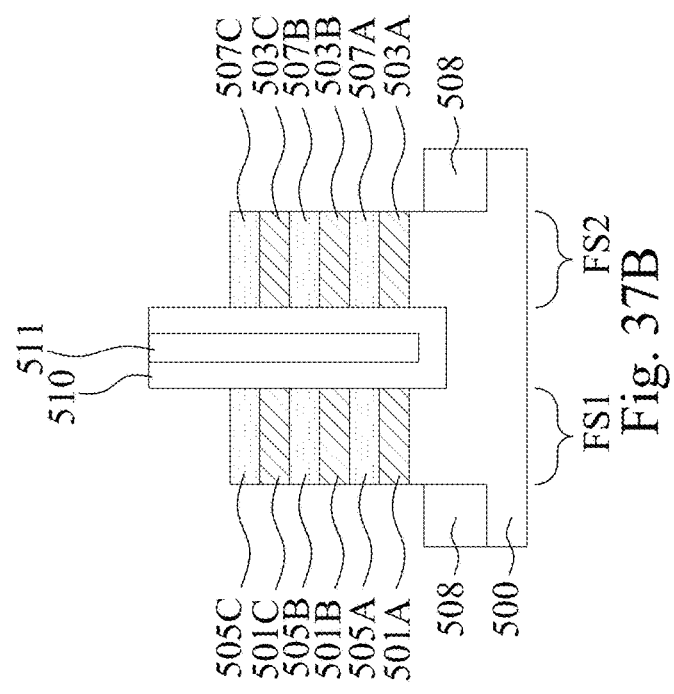

FIG. 37A is a top view of an intermediate stage in manufacturing of nano-FETs, and FIG. 37B is a cross-sectional view corresponding to the line B-B' illustrated in FIG. 37A. In FIGS. 37A and 37B, the dummy gate structure 512 is removed in one or more etching steps, so that a gate trench is formed between corresponding gate spacers 514. In some embodiments, an ILD layer is formed over the epitaxial source/drain structures 516S, 516D, 518S, 518D before removing the dummy gate structure 512. In some embodiments, the dummy gate structure 512 is removed by an anisotropic dry etch process. For example, the etching process may include a dry etch process using reaction gas(es) that selectively etch the dummy gate structure 512 at a faster rate than the gate spacers 514 and the ILD layer. The gate trench exposes the nanostructure layers 505 and interbridge layers 501 on the left side of the dielectric walls 510, 511, and the nanostructure layers 507 and interbridge layers 503 on the right side of the dielectric walls 510, 511. The gate trench also exposes portions of the dielectric walls 510, 511 between the gate spacers 514.

Figure 38A:
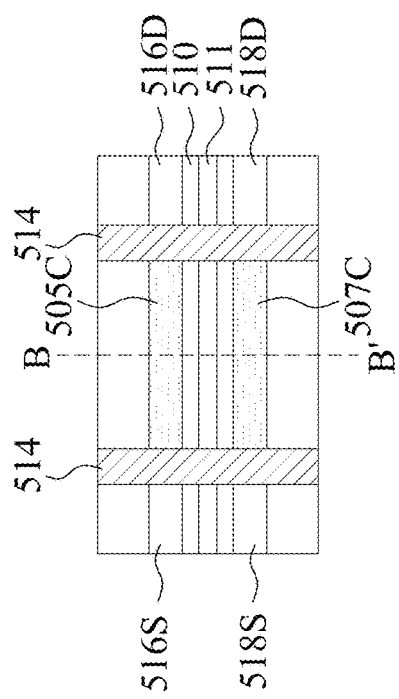
Figure 38B:
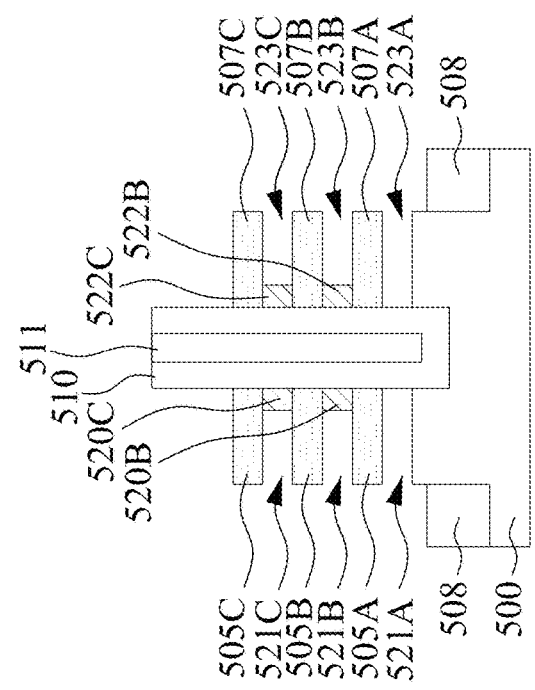

FIG. 38A is a top view of an intermediate stage in manufacturing of nano-FETs, and FIG. 38B is a cross-sectional view corresponding to the line B-B' illustrated in FIG. 38A. In FIGS. 38A and 38B, a selective etching process is performed to selectively etch the interbridge layers 501 and 503 exposed in the gate trench between the gate spacers 514. On the left side of the dielectric walls 510, 511, this selective etching step forms an opening 521A below the nanostructure layer 505A, an opening 521B between the nanostructure layers 505A and 505B, and an opening 521C between the nanostructure layers 505B and 505C. On the right side of the dielectric wall 510, this selective etching step forms an opening 523A below the nanostructure layer 507A, an opening 523B between the nanostructure layers 507A and 507B, and an opening 523C between the nanostructure layers 507B and 507C. In some embodiments where the interbridge layers are SiGe, this etching step uses a SiGe selective etchant. Process details about the SiGe selective etching step is similar to that discussed previously with respect to FIGS. 20A-20B, and thus they are not repeated of the sake of brevity.

In some embodiments, the etching step selectively etches the interbridge layers 501 and 503 at a faster etch rate than it etches the nanostructure layers 505 and 507. Therefore, the nanostructure layers 505 and 507 may remain substantially intact after the selective etching step is complete. In some embodiments, the etching step also etches the interbridge layers 501A and 503A at a faster etch rate than it etches the interbridge layers 501B-C and 503B-C, which in turn leaves portions 520B and 520C of the interbridge layers 501B and 501C on the left side of the dielectric walls 510, 511, and also leaves portions 522B and 522C of the interbridge layers 503B and 503C on the right side of the dielectric walls 510, 511, while leaving no portion of the interbridge layer 501A on the left side of the dielectric walls 510, 511 and no portion of the interbridge layer 503A on the right side of the dielectric walls 510, 511.

The remaining portions 520B-520C bridge the nanostructure layers 505A-505C and thus collectively form a reversed E-shaped semiconductor channel structure that allows a current flow between the epitaxial source/drain structures 516S and 516D. The remaining portions 520B-520C can thus be referred to as interbridge channels on the left side of the dielectric walls 510, 511, and the nanostructure layers 505A-505C can be referred to as nanostructure channels on the left side of the dielectric walls 510, 511. The remaining portions 522B-522C bridge the nanostructure layers 507A-507C and thus collectively form an E-shaped semiconductor channel structure that allows a current flow between the epitaxial source/drain structures 518S and 518D. The remaining portions 522B-522C can thus be referred to as interbridge channels on the right side of the dielectric walls 510, 511, and the nanostructure layers 507A-507C can be referred to as nanostructure channels on the right side of the dielectric walls 510, 511. The reversed E-shaped channel structure is symmetric with the E-shaped channel structure about the dielectric walls 510, 511, as illustrated in the cross-sectional view of FIG. 38B.

In some embodiments where the interbridge layer 501A and 503A have a higher germanium atomic concentration than the interbridge layers 501B-501C and 503B-503C, the fluorine-based etchant can etch the interbridge layer 501A and 503A at a faster etch rate, because in the etching step using the fluorine-based etchant, the SiGe etch rate increases as the germanium atomic percentage increases. In some embodiments where the interbridge layers 501B and 501C have substantially the same germanium concentration, the resultant interbridge channels 520B and 520C have substantially the same width as illustrated in FIG. 38B. In some embodiments where the interbridge layer 501C has a higher germanium atomic concentration than the interbridge layer 501B, the resultant interbridge channel 520C has a smaller width than the resultant interbridge channel 520B because of the etch rate difference resulting from the fluorine-based etchant, which in turn allows for a width difference in the interbridge channels as illustrated in FIG. 8A. Similarly, in some embodiments where the interbridge layers 503B and 503C have substantially the same germanium concentration, the resultant interbridge channels 522B and 522C have substantially the same width as illustrated in FIG. 38B. In some embodiments where the interbridge layer 503C has a higher germanium atomic concentration than the interbridge layer 503B, the resultant interbridge channel 522C has a smaller width than the resultant interbridge channel 522B because of the etch rate difference resulting from the fluorine-based etchant, which in turn allows for a width difference in the interbridge channels as illustrated in FIG. 8A.

Figure 39A:
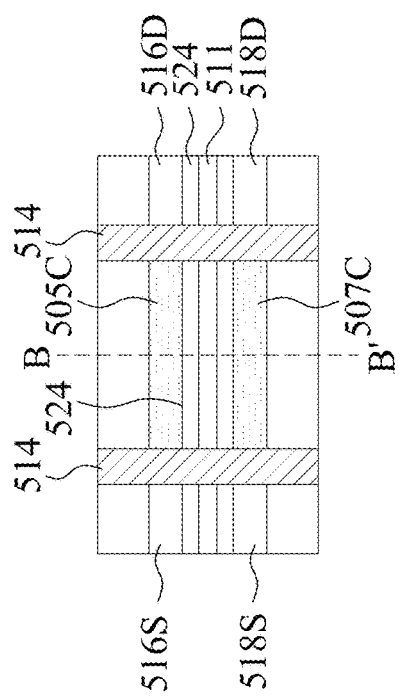
Figure 39B:
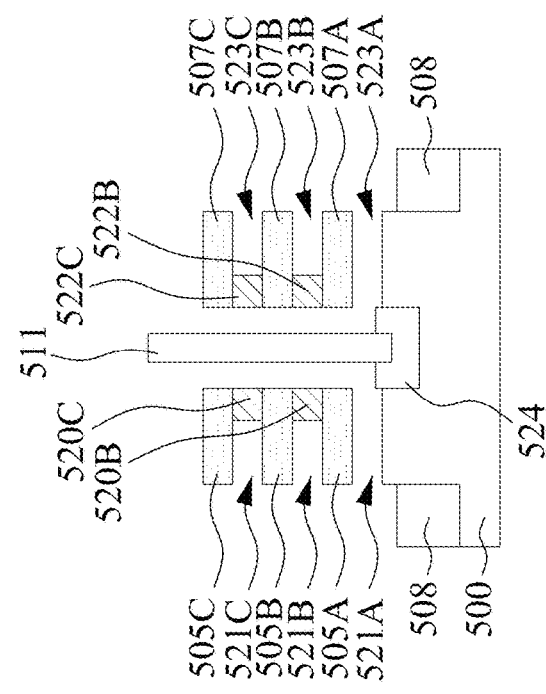

FIG. 39A is a top view of an intermediate stage in manufacturing of nano-FETs, FIG. 39B is a cross-sectional view corresponding to the line B-B' illustrated in FIG. 39A. In FIGS. 39A-39B, the outer dielectric wall 510 is recessed, for example, by using a selective etching process that etches the dielectric material of the outer dielectric wall 510 at a faster etch rate than it etches the dielectric material of the inner dielectric wall 511 and the semiconductor materials of the nanostructure channels 505, 507 and interbridge channels 520, 522, and thus the inner dielectric wall 511, the nanostructure channels 505, 507 and interbridge channels 520, 522 remain substantially intact after the selective etching process is complete. In some embodiments where the outer dielectric wall 510 is made of silicon oxide ($SiO_2$), the silicon oxide wall 510 can be selectively etched using a cyclic process including one or more repetitions of a plasma treatment step and an annealing step. Process details about the $SiO_2$ selective etching process is discussed previously with respect to FIGS. 21A-21B, and thus they are not repeated for the sake of brevity. In some embodiments in the $SiO_2$ selective etching process, an etch rate ratio of the outer dielectric wall 510 ($SiO_2$) to the inner dielectric wall 511 ($Si_3O_4$) is in a range from about 3:1 to about 8:1 (e.g., about 4:1). After the $SiO_2$ selective etching process is complete, a portion 524 of the outer dielectric wall 510 remains in the substrate 500, and the remaining portion 524 may have a topmost position higher than the STI regions 508.

Figure 40A:
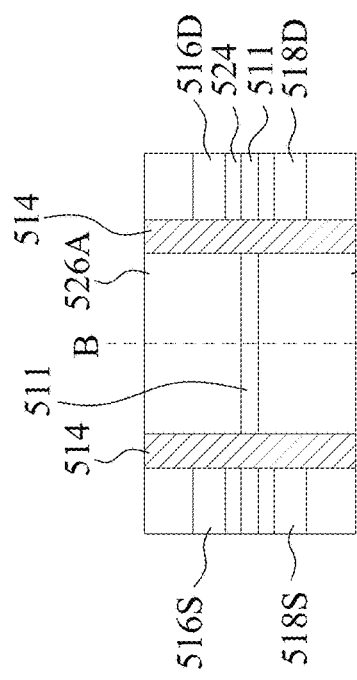
Figure 40B:
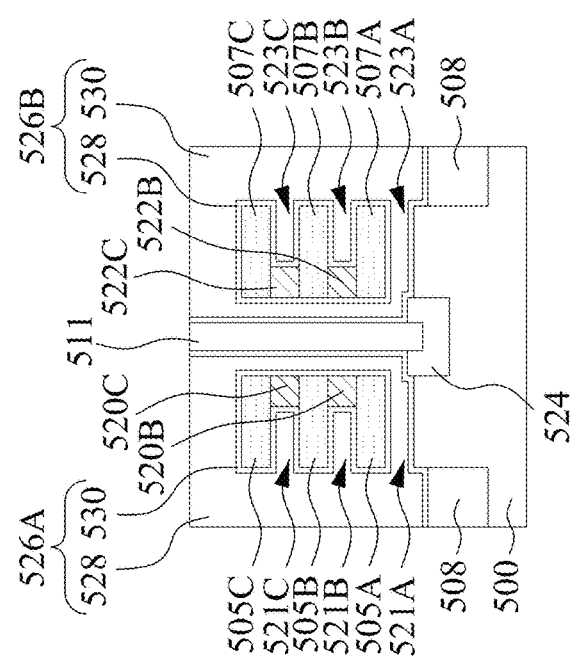

FIG. 40A is a top view of an intermediate stage in manufacturing of nano-FETs, FIG. 40B is a cross-sectional view corresponding to the line B-B' illustrated in FIG. 40A. In FIGS. 40A-40B, two separate replacement gate structures 526A and 526B are formed in the gate trench between the gate spacers 514. The gate structure 526A is formed on the left side of the inner dielectric wall 511 to surround the nanostructure channels 505 and interbridge channels 520. The gate structure 526B is formed on the right side of the inner dielectric wall 511 to surround the nanostructure channels 507 and interbridge channels 522. As a result, the left side channel structure of alternating nanostructure channels 505 and interbridge channels 520 and the right side channel structure of alternating nanostructure channels 507 and interbridge channels 522 are controlled by different gate structures 526A, 526B. The gate structures 526A, 526B are high-k/metal gate structures each including a gate dielectric layer 528, and a gate metal 530 formed around the gate dielectric layer 528. The gate metal 530 may include one or more work function metal layers formed around the gate dielectric layer 528, and a fill metal formed around the one or more work function metal layers and filling a remainder of gate trench. Materials about the gate structures 526A, 526B are similar to that of the gate structure 326, and thus they are not repeated for the sake of brevity.

In some embodiments, formation of the gate structures 526A, 526B may include depositing one or more layers of dielectric materials and one or more layers of metal materials, and performing a CMP process on the one or more layers of dielectric materials and one or more layers of metal materials until the inner dielectric wall 511 is exposed, thus leaving a first portion of the one or more layers of dielectric materials and one or more layers of metal materials on the left side of the inner dielectric wall 511 to serve as the gate structure 526A, and leaving a second portion of the one or more layers of dielectric materials and one or more layers of metal materials on the right side of the inner dielectric wall 511 to serve as the gate structure 526B. In such embodiments, the gate structures 526A and 526B may include the same materials.

Figure 41:
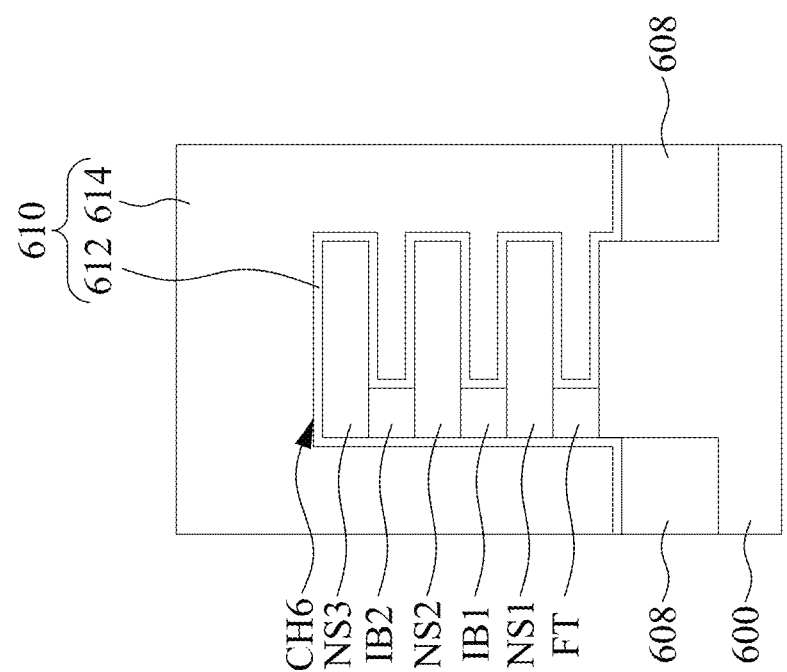
FIG. 41 is a cross-sectional view of a nano-FET in accordance with some embodiments of the present disclosure.

FIG. 41 is a cross-sectional view of a nano-FET in accordance with some embodiments of the present disclosure. In FIG. 41, the nano-FET is formed on a substrate 600 and includes a channel structure CH6 and a gate structure 610 extending over the channel structure CH6 and STI regions 608. The channel structure CH6 includes alternating nanostructure channels NS1-NS3 and interbridge channels IB1 and IB2, and further includes a foot channel FT extending from the bottommost nanostructure channel NS1 to a fin of the substrate 600. The foot channel FT may be a remaining portion of a bottommost interbridge layer 302A as illustrated in FIG. 19B.

In some embodiments, the foot channel FT has substantially the same germanium atomic concentration and width as the interbridge channels IB1 and IB2. In some embodiments, the foot channel FT has a higher germanium atomic concentration and a smaller width than the interbridge channels IB1 and IB2. In some other embodiments, the foot channel FT has a lower germanium atomic concentration and a larger width than the interbridge channels IB1 and IB2. The gate structure 610 includes a gate dielectric layer 612 over the channel structure CH6 and a gate metal 614 over the gate dielectric layer 612.

Figure 42:
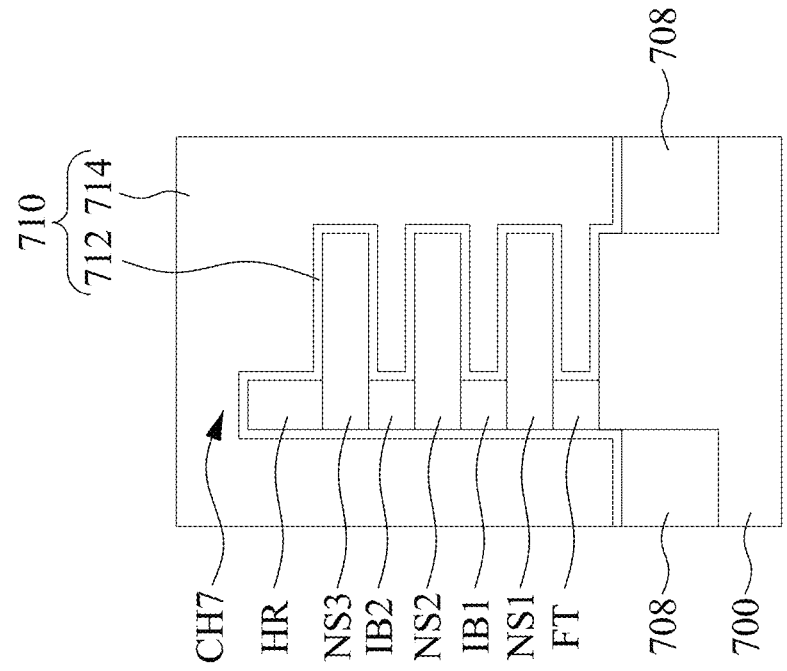
FIG. 42 is a cross-sectional view of a nano-FET in accordance with some embodiments of the present disclosure.

FIG. 42 is a cross-sectional view of a nano-FET in accordance with some embodiments of the present disclosure. In FIG. 42, the nano-FET is formed on a substrate 700 and includes a channel structure CH7 and a gate structure 710 extending over the channel structure CH7 and STI regions 708. The channel structure CH7 includes alternating nanostructure channels NS1-NS3 and interbridge channels IB1 and IB2, and further includes a foot channel FT extending from the bottommost nanostructure channel NS1 to a fin of the substrate 700, and a hair channel HR extending upwardly from the topmmost nanostructure channel NS3. The hair channel HR may be formed by, for example, forming an additional interbridge layer over the nanostructure layer 304C as illustrated in FIG. 10B, and then selectively etching the additional interbridge layer at the step as illustrated in FIG. 20B to form the hair channel HR.

In some embodiments, the hair channel HR has substantially the same germanium atomic concentration and width as the interbridge channels IB1 and IB2 and the foot channel FT. In some embodiments, the hair channel HR has a higher germanium atomic concentration and a smaller width than the interbridge channels IB1 and IB2 and the foot channel FT. In some other embodiments, the hair channel HR has a lower germanium atomic concentration and a larger width than the interbridge channels IB1 and IB2 and the foot channel FT. The gate structure 710 includes a gate dielectric layer 712 over the channel structure CH7 and a gate metal 714 over the gate dielectric layer 712.

FIG. 43 is a cross-sectional view of a nano-FET in accordance with some embodiments of the present disclosure. In FIG. 43, the nano-FET is formed on a substrate 800 and includes a channel structure CH8 and a gate structure 810 extending over the channel structure CH8 and STI regions 808. The gate structure 810 includes a gate dielectric layer 812 over the channel structure CH8 and a gate metal 814 over the gate dielectric layer 812. The channel structure CH8 includes alternating nanostructure channels NS1-NS3 and interbridge channels IB1 and IB2, and further includes a hair channel HR extending upwardly from the topmmost nanostructure channel NS3, and a foot channel FT extending downwardly from the bottommost nanostructure NS1 to a fin of the substrate 800. The foot channel FT may be a remaining portion of a bottommost interbridge layer 302A as illustrated in FIG. 19B. The hair channel HR may be formed by, for example, forming an additional interbridge layer over the nanostructure layer 304C as illustrated in FIG. 10B, and then selectively etching the additional interbridge layer at the step as illustrated in FIG. 20B to form the hair channel HR.

In FIG. 43, the left side surfaces of the interbridge channels IB1, IB2, foot channel FT, and hair channel HR are laterally set back from the left side surfaces of the nanostructure structures NS1-NS3. Such lateral offset profile may be formed by, for example, selectively etching the interbridge channels IB1, IB2, foot channel FT, and hair channel HR after the dielectric wall 310 is removed from left side surfaces of the interbridge channels IB1, IB2, foot channel FT, and hair channel HR, as illustrated in the step of FIG. 21B.

FIG. 44 is a cross-sectional view of a nano-FET in accordance with some embodiments of the present disclosure. In FIG. 44, the nano-FET is formed on a substrate 900 and includes a channel structure CH9 and a gate structure 910 extending over the channel structure CH9 and STI regions 908. The gate structure 910 includes a gate dielectric layer 912 over the channel structure CH9 and a gate metal 914 over the gate dielectric layer 912. The channel structure CH9 includes alternating nanostructure channels NS1-NS3 and interbridge channels IB11-IB32, and further includes hair channels HR1-HR3 extending upwardly from the topmost nanostructure channel NS3, and foot channels FT1-FT3 extending downwardly from the bottommost nanostructure channel NS1 to a fin of the substrate 900. The foot channel FT1, interbridge channels IB11, IB12, and hair channels HR1 are localized to a first region R1 of the nanostructure channels NS1-NS3; the foot channel FT2, interbridge channels IB21, IB22, and hair channels HR2 are localized to a second region R2 of the nanostructure channels NS1-NS3 spaced apart from the first region R1; and the foot channel FT3, interbridge channels IB31, IB32, and hair channels HR3 are localized to a third region R3 of the nanostructure channels NS1-NS3 spaced apart from both the first and second regions R1 and R2. The channel structure CH9 may be formed by, for example, forming a layer stack of alternating first and second semiconductor layers, forming a patterned mask covering the regions R1-R3, selectively etching portions of the second semiconductor layers exposed by the patterned mask, and then removing the patterned mask from the regions R1-R3.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that the on-current of a transistor can be enhanced by adding interbridge channels between neighboring nanostructure channels. Another advantage is that the on-current enhancement can be further increased by forming interbridge channels localized to a periphery region or off-center region of the nanostructure channels.

In some embodiments, a device comprises source/drain regions over a substrate and spaced apart along a first direction, a first gate structure between the source/drain regions, and a first channel structure surrounded by the first gate structure. The first channel structure comprises alternately stacking first semiconductor layers and second semiconductor layers. When viewed in a cross section taken along a second direction perpendicular to the first direction, central axes of the second semiconductor layers are laterally offset from central axes of the first semiconductor layers. In some embodiments, the second semiconductor layers have a smaller width than the first semiconductor layers. In some embodiments, the second semiconductor layers are made of a different material than the first semiconductor layers. In some embodiments, the second semiconductor layers have a greater germanium atomic percentage than the first semiconductor layers. In some embodiments, the second semiconductor layers have substantially a same width. In some embodiments, an upper one of the second semiconductor layers has a smaller width than a lower one of the second semiconductor layers. In some embodiments, a width difference between the second semiconductor layers is greater than a width difference between the first semiconductor layers. In some embodiments, the second semiconductor layers have different germanium atomic percentages. In some embodiments, an upper one of the second semiconductor layers has a greater germanium atomic percentage than a lower one of the second semiconductor layers. In some embodiments, the device further comprises a second channel structure surrounded by the first gate structure, and the second channel structure is symmetric with the first channel structure when viewed in the cross section taken along the second direction. In some embodiments, the device further comprises a second channel structure symmetric with the first channel structure when viewed in the cross section taken along the second direction; a second gate structure surrounding the second channel structure; and a dielectric wall separating the first gate structure from the second gate structure.

In some embodiments, a device comprises a source region, a drain region separated from the source region along a first direction, and a channel structure interposing the source region and the drain region. The channel structure comprises alternately stacking first semiconductor layers and second semiconductor layers. When viewed in a cross section taken along a second direction perpendicular to the first direction, the first semiconductor layers have opposite first and second side surfaces, the second semiconductor layers have opposite third and fourth side surfaces, the third side surfaces of the second semiconductor layers are aligned with the first side surfaces of the first semiconductor layers, and the fourth side surfaces of the second semiconductor layers are laterally set back from the second side surfaces of the first semiconductor layers. In some embodiments, the second semiconductor layers non-overlap with central axes of the first semiconductor layers. In some embodiments, a width of the second semiconductor layers is less than half a width of the first semiconductor layers. In some embodiments, the fourth side surfaces of the second semiconductor layers are misaligned with each other. In some embodiments, the first semiconductor layers are germanium-free semiconductor layers, and the second semiconductor layers are germanium-containing semiconductor layers.

In some embodiments, a method comprises forming a fin structure having a stack of alternating first semiconductor layers and second semiconductor layers over a substrate; forming a dielectric wall on a first longitudinal side of the fin structure but not on a second longitudinal side of the fin structure; performing a first etching process that etches the second semiconductor layers at a faster etch rate than etching the first semiconductor layers; after performing the first etching process, performing a second etching process to remove the dielectric wall; and after removing the dielectric wall, forming a gate structure over the first semiconductor layers and the second semiconductor layers. In some embodiments, the first etching process etches a bottommost one of the second semiconductor layers at a faster etch rate than etching upper ones of the semiconductor layers. In some embodiments, the second etching process etches the dielectric wall at a faster etch rate than etching the first semiconductor layers and the second semiconductor layers. In some embodiments, the method further comprises recessing a portion of the fin structure after forming the dielectric wall; and forming an epitaxial source/drain structure on the recessed portion of the fin structure and contacting a side surface of the dielectric wall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
source/drain regions over a substrate and spaced apart along a first direction;
a first gate structure between the source/drain regions; and
a first channel structure surrounded by the first gate structure, the first channel structure comprising alternately stacking first semiconductor layers and second semiconductor layers, wherein when viewed in a cross section taken along a second direction perpendicular to the first direction, central axes of the second semiconductor layers are laterally offset from central axes of the first semiconductor layers, wherein the second semiconductor layers of the first channel structure electrically connect a first one of the source/drain regions to a second one of the source/drain regions.

2. The device of claim 1, wherein the second semiconductor layers have a smaller width than the first semiconductor layers.

3. The device of claim 1, wherein the second semiconductor layers are made of a different material than the first semiconductor layers.

4. The device of claim 1, wherein the second semiconductor layers have a greater germanium atomic percentage than the first semiconductor layers.

5. The device of claim 1, wherein the second semiconductor layers have substantially a same width.

6. The device of claim 1, wherein an upper one of the second semiconductor layers has a smaller width than a lower one of the second semiconductor layers.

7. The device of claim 1, wherein a width difference between the second semiconductor layers is greater than a width difference between the first semiconductor layers.

8. The device of claim 1, wherein the second semiconductor layers have different germanium atomic percentages.

9. The device of claim 1, wherein an upper one of the second semiconductor layers has a greater germanium atomic percentage than a lower one of the second semiconductor layers.

10. The device of claim 1, further comprising:
a second channel structure surrounded by the first gate structure, the second channel structure being symmetric with the first channel structure when viewed in the cross section taken along the second direction.

11. The device of claim 1, further comprising:
a second channel structure being symmetric with the first channel structure when viewed in the cross section taken along the second direction;
a second gate structure surrounding the second channel structure; and
a dielectric wall separating the first gate structure from the second gate structure.

12. A device comprising:
a source region;
a drain region separated from the source region along a first direction; and
a channel structure interposing the source region and the drain region, the channel structure comprising alternately stacking first semiconductor layers and second semiconductor layers, wherein when viewed in a cross section taken along a second direction perpendicular to the first direction, the first semiconductor layers have opposite first and second side surfaces, the second semiconductor layers have opposite third and fourth side surfaces, the third side surfaces of the second semiconductor layers are aligned with the first side surfaces of the first semiconductor layers, and the fourth side surfaces of the second semiconductor layers are laterally set back from the second side surfaces of the first semiconductor layers, wherein the second semiconductor layers of the channel structure electrically connect the source region to the drain region.

13. The device of claim 12, wherein the second semiconductor layers non-overlap with central axes of the first semiconductor layers.

14. The device of claim 12, wherein a width of the second semiconductor layers is less than half a width of the first semiconductor layers.

15. The device of claim 12, wherein the fourth side surfaces of the second semiconductor layers are misaligned with each other.

16. The device of claim 12, wherein the first semiconductor layers are germanium-free semiconductor layers, and the second semiconductor layers are germanium-containing semiconductor layers.

17. The device of claim 12, wherein when viewed in the cross section taken along the second direction perpendicular to the first direction, the third side surfaces of the second semiconductor layers and the first side surfaces of the first semiconductor layers form a straight line interfacing a gate dielectric of a gate structure.

18. A method comprising:
forming a fin structure having a stack of alternating first semiconductor layers and second semiconductor layers over a substrate;
forming a dielectric wall on a first longitudinal side of the fin structure but not on a second longitudinal side of the fin structure;
recessing a portion of the fin structure after forming the dielectric wall;
forming an epitaxial source/drain structure on the recessed portion of the fin structure, the epitaxial source/drain structure contacting a side surface of the dielectric wall;
performing a first etching process that etches the second semiconductor layers at a faster etch rate than etching the first semiconductor layers;
after performing the first etching process, performing a second etching process to remove the dielectric wall; and
after removing the dielectric wall, forming a gate structure over the first semiconductor layers and the second semiconductor layers.

19. The method of claim 18, wherein the first etching process etches a bottommost one of the second semiconductor layers at a faster etch rate than etching upper ones of the second semiconductor layers.

20. The method of claim 18, wherein the second etching process etches the dielectric wall at a faster etch rate than etching the first semiconductor layers and the second semiconductor layers.

* * * * *